US007022453B2

(12) United States Patent
Miyake et al.

(10) Patent No.: US 7,022,453 B2
(45) Date of Patent: Apr. 4, 2006

(54) MULTICOLOR IMAGE-FORMING MATERIAL AND MULTICOLOR IMAGE-FORMING METHOD

(75) Inventors: Kazuhito Miyake, Shizuoka (JP); Junichi Fujimori, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/403,021

(22) Filed: Apr. 1, 2003

(65) Prior Publication Data

US 2003/0207197 A1 Nov. 6, 2003

(30) Foreign Application Priority Data

Apr. 1, 2002 (JP) .......................... P.2002-098803
Jan. 28, 2003 (JP) .......................... P.2003-018865

(51) Int. Cl.
*G03F 7/34* (2006.01)
*G03F 7/11* (2006.01)

(52) U.S. Cl. ...................... 430/200; 430/201; 430/952; 430/964

(58) Field of Classification Search ................ 430/200, 430/201, 964, 952
See application file for complete search history.

(56) References Cited

FOREIGN PATENT DOCUMENTS

JP 5-58045 3/1993
JP 6-219052 8/1994

*Primary Examiner*—Richard L. Schilling
(74) *Attorney, Agent, or Firm*—Sughrue Mion, PLLC

(57) ABSTRACT

A multicolor image-forming material comprising: an image-receiving sheet comprising a support and an image-receiving layer; and at least four (yellow, magenta, cyan, black and the like) thermal transfer sheets each comprising a support, a light-to-heat converting layer and an image-forming layer, wherein image-recording is performed by the method comprising superposing each one of the at least four thermal transfer sheets on the image-receiving sheet to be in a state of the image-forming layer being in contact with the image-receiving layer; and irradiating the thermal transfer sheet with laser beams in two-dimensional array to transfer an image in an area of the image-forming layer subjected to irradiation onto the image-receiving layer, and a recording area of a multicolor image in each of the thermal transfer sheets is a size of 515 mm×728 mm or more, a resolution of the transferred image is 2,400 dpi or more, and each of the light-to-heat converting layers comprises from 1 to 20% by weight of a substance which is liquid at 30° C.

9 Claims, 2 Drawing Sheets

MULTICOLOR IMAGE-FORMING MATERIAL AND MULTICOLOR IMAGE-FORMING METHOD

FIELD OF THE INVENTION

The present invention relates to a multicolor image-forming material for forming a full color image of high speed and high resolution with a laser beam, and a method for forming a multicolor image. In particular, the present invention relates to a multicolor image-forming material which is useful in the field of printing for forming a color proof (DDCP: direct digital color proof) or a mask image from digital image signals by laser recording, and relates to a method for forming a multicolor image.

BACKGROUND OF THE INVENTION

In the field of graphic arts, printing of a printing plate is performed with a set of color separation films formed from a color original by using a lith film. In general, color proofs are formed from color separation films before actual printing work for checking an error in the color separation step and the necessity for color correction. Color proofs are desired to realize high resolution which makes it possible to surely reproduce a half tone image and high performances such as high stability of processing. Further, for obtaining color proofs closely approximating to an actual printed matter, it is preferred to use materials which are used in actual printing as the materials for making color proofs, e.g., the actual printing paper as the base material and pigments as the coloring materials. As the method for forming a color proof, a dry method not using a developing solution is strongly desired.

As the dry method for forming color proofs, a recording system of directly forming color proofs from digital signals has been developed with the spread of electronized system in preprocessing of printing (pro-press field) in recent years. Such electronized system aims at forming in particular high quality color proofs and generally reproduces a dot image of 150 lines/inch or higher. For recording a proof of high image quality from digital signals, laser beams capable of modulation by digital signals and capable of finely diaphragming recording lights are used as recording heads. Therefore, the development of an image-forming material having high recording sensitivity to laser beams and exhibiting high resolution property capable of reproducing highly minute dots is required.

As the recording material to be used in a transfer image-forming method using laser beams, a heat fusion transfer sheet comprising a support having thereon in the order of a light-to-heat (photothermal) converting layer which absorbs laser beams and generates heat, and an image-forming layer which contains a pigment dispersed in components such as a heat fusion type wax and a binder is known (JP-A-5-58045 (the term "JP-A" as used herein means an "unexamined published Japanese patent application")). In an image-forming method using such a recording material, the heat generated at the area of a light-to-heat converting layer irradiated with laser beams fuses an image-forming layer corresponding to the irradiated area, and the fused layer is transferred to an image-receiving sheet arranged on a transfer sheet by lamination, thus a transferred image is formed on the image-receiving sheet.

Further, a thermal transfer sheet comprising a support having provided thereon in the order of a light-to-heat converting layer containing a light-to-heat converting material, an extremely thin heat-peeling layer (from 0.03 to 0.3 μm), and an image-forming layer containing a coloring material is disclosed in JP-A-6-219052. In the thermal transfer sheet, the bonding strength between the image-forming layer and the light-to-heat converting layer bonded via the intervening heat-peeling layer is reduced by laser beam irradiation, as a result, a highly minute image is formed on the image-receiving sheet arranged by lamination on the thermal transfer sheet. The image-forming method by the thermal transfer sheet utilizes so-called ablation, specifically the heat-peeling layer partially decomposes at the area irradiated with laser beams and vaporizes, thereby the bonding strength of the image-forming layer and the light-to-heat converting layer at the irradiated area is reduced and the image-forming layer at that area is transferred to the image-receiving sheet laminated thereon These image-forming methods have advantages such that an actual printing paper provided with an image-receiving layer (an adhesion layer) can be used as the material of an image-receiving sheet, a multicolor image can be easily obtained by transferring images different in colors in sequence on the image-receiving sheet, and image-forming methods utilizing ablation have an advantage of capable of easily obtaining highly minute image. Therefore, these methods are useful for forming a color proof (DDCP: direct digital color proof) or a highly minute mask image.

For shortening the time required in recording when an image is recorded with laser beams, laser beams comprising multi-beams using a plurality of laser beams are used in recent years. When recording is performed by using a conventional thermal transfer sheet by laser beams comprising multi-beams, there are cases where the image density of the transferred image formed on an image-receiving sheet is insufficient. The reduction of image density is particularly conspicuous in the case of recording with high energy and laser recording. As a result of the investigation by the present inventors, it was found that the reduction of image density was attributable to transfer unevenness caused by irradiation with high energy laser irradiation.

Further improvement of sensitivity and the reduction of temperature and moisture dependency are desired for conventional image-forming materials.

SUMMARY OF THE INVENTION

The present invention aims at solving the problems of the prior art technique and to accomplish the following objects. That is, the objects of the present invention are to provide a multicolor image-forming material which is characterized in that: 1) a thermal transfer sheet can provide sharpness of dots and excellent stability by transfer of a coloring material membrane, which is not influenced by the light source of illumination as compared with the pigment material and the printed matter, 2) an image-receiving sheet can receive stably and surely the image-forming layer in a thermal transfer sheet by laser energy, 3) transfer to actual printing paper can be effected corresponding to the range of from 64 to 157 $g/m^2$ such as art paper (coat paper), mat paper and finely coated paper, delicate texture can be imaged, and a high-key part can be reproduced accurately, and 4) extremely stable transfer releasability can be obtained, and to provide a method for forming a multicolor image. Above all, the objects of the present invention are to provide a multicolor image-forming material of high speed by which an image having good image quality and stable transfer density can be formed on an image-receiving sheet even when recording is performed by multi-beam laser beams of high energy under different temperature and humidity conditions, and to provide a method for forming a multicolor image.

That is, the present invention provides the following multicolor image-forming material and multicolor image-forming method for achieving the above objects.

(1) A multicolor image-forming material which comprises an image-receiving sheet comprising a support having provided thereon at least an image-receiving layer, and four or more thermal transfer sheets including yellow, magenta, cyan and black each comprising a support having at least a light-to-heat converting layer and an image-forming layer, wherein image-recording is performed by irradiating the image-forming layer in each thermal transfer sheet and the image-receiving layer in the image-receiving sheet superposed vis-a-vis with (multi-beam) laser beams in two-dimensional array from the support side of the thermal transfer sheets, thereby the area of the image-forming layer subjected to irradiation with laser beams is transferred onto the image-receiving layer in the image-receiving sheet, wherein the recording area of the multicolor image in each thermal transfer sheet is a size of 515 mm×728 mm or more, the resolution of the transferred image is 2,400 dpi or more, and the light-to-heat converting layer in each thermal transfer sheet contains from 1 to 20 mass % (% by weight) of a substance which is liquid at 30° C.

(2) The multicolor image-forming material as described in the above item (1), wherein the substance which is liquid at 30° C. has a boiling point of 120° C. or more.

(3) The multicolor image-forming material as described in the above item (1) or (2), wherein the substance which is liquid at 30° C. has the solubility in water of 10 g or more.

(4) The multicolor image-forming material as described in the above item (1), (2) or (3), wherein the substance which is liquid at 30° C. has an SP value by Okitsu method of 20 or more.

(5) The multicolor image-forming material as described in any of the above items (1) to (4), wherein the difference between the SP values by Okitsu method of the binder resin of the light-to-heat converting layer and the binder resin of the image-forming layer is 1.5 or more.

(6) The multicolor image-forming material as described in any of the above items (1) to (5), wherein an intermediate layer is provided between the light-to-heat converting layer and the image-forming layer in each thermal transfer sheet.

(7) The multicolor image-forming material as described in any of the above items (1) to (6), wherein a subbing layer is provided between the light-to-heat converting layer and the support in each thermal transfer sheet.

(8) The multicolor image-forming material as described in any of the above items (1) to (7), wherein the ratio of the optical density (OD) of the image-forming layer to the layer thickness (μm unit) in each thermal transfer sheet, OD/layer thickness, is 1.80 or more, and the contact angle of the image-receiving layer in the image-receiving sheet with water is 86° or less.

(9) The multicolor image-forming material as described in any of the above items (1) to (8), wherein the light-to-heat converting layer in each thermal transfer sheet contains at least one of polyimide or polyamide as a binder.

(10) A multicolor image-forming method using an image-receiving sheet comprising a support having provided thereon at least an image-receiving layer, and four or more thermal transfer sheets including yellow, magenta, cyan and black each comprising a support having thereon at least a light-to-heat converting layer and an image-forming layer, which comprises the steps of superposing the image-forming layer in each thermal transfer sheet and the image-receiving layer in the image-receiving sheet vis-a-vis, irradiating the image-forming layer and the image-receiving layer with (multi-beam) laser beams in two-dimensional array from the support side of the thermal transfer sheets, and transferring the area of the image-forming layer irradiated with laser beams to the image-receiving layer in the image-receiving sheet to thereby effect image recording, wherein the image-receiving sheet and each thermal transfer sheet of the multicolor image-forming material as described in any of the above items (1) to (9) are used as the image-receiving sheet and each thermal transfer sheet.

The multicolor image-forming material and the multicolor image-forming method in the present invention can achieve the above objects, and the present invention has the effect of forming an image having higher sensitivity, better image quality and stabler transfer density than those of conventional ones on the image-receiving sheet by adding from 1 to 20 mass % of a substance which is liquid at 30° C. to the light-to-heat converting layer in the thermal transfer sheet. The present invention can also realize the recording area of the multicolor image of a size of 515 mm×728 mm or more, high resolution of the transferred image of 2,400 dpi or more, and transferring to actual paper by adopting a laser membrane thermal transfer system, using pigment coloring materials and performing actual dot recording.

DESCRIPTION OF REFERENCE CHARACTERS

Figure 1A:
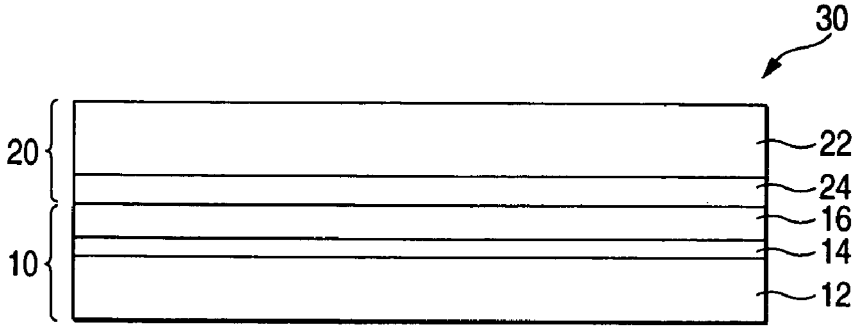
FIG. 1 (FIGS. 1(*a*) to 1(*c*)) is a drawing showing the outline of the scheme of multicolor image-forming by membrane thermal transfer by irradiation with a laser.

| | |
|---|---|
| 1: | Recording unit |
| 2: | Recording head |
| 3: | By-scan rail |
| 4: | Recording drum |
| 5: | Thermal transfer sheet-loading unit |
| 6: | Image-receiving sheet roll |
| 7: | Carrier roller |
| 8: | Squeeze roller |
| 9: | Cutter |
| 10: | Thermal transfer sheet |
| 10K, 10C, 10M, 10Y: | Thermal transfer sheet rolls |
| 12: | Support |
| 14: | Light-to-heat converting layer |
| 16: | Image-forming layer |
| 20: | Image-receiving sheet |
| 22: | Support for image-receiving sheet |
| 24: | Image-receiving layer |
| 30: | Laminate |
| 31: | Discharge platform |
| 32: | Discard port |
| 33: | Discharge port |
| 34: | Air |
| 35: | Discard box |

DETAILED DESCRIPTION OF THE INVENTION

A contracted proof which substitutes a proof sheet and an analog style color proof becomes necessary in the film-less CTP (computer-to-plate) age in recent years. For obtaining the approval of customers, color reproduction which coincides with the printed matter and the analog style color proof is required, and in compliance with these various requirements, the present inventors have developed a DDCP system capable of transfer to actual paper without generating moire by using the same pigment materials as used in the printing inks. The object of the DDCP system is a large sized (A2/B2) digital direct color proof system high in approximation to a printed matter capable of transfer to actual paper by using the same pigment materials as used in the printing inks. The present invention can be preferably used in the DDCP system developed by the present inventors. The whole of the developed system will be described in sequence including the contents of the present invention.

The present invention is characterized in that the light-to-heat converting layer in each thermal transfer sheet contains from 1 to 20 mass %, preferably from 3 to 15 mass %, of a substance which is liquid at 30° C. (hereinafter referred to as "a liquid substance"). When the liquid substance content is less than 1 mass %, the liquid substance hardly contributes to sensitivity, and when the content is more than 20 mass %, there arise problems in the film formation and adhesion resistance of the thermal transfer sheet.

The liquid substance preferably has a boiling point of 120° C. or more from the viewpoint of the volatility during storage at room temperature and the volatility at coating and drying. It is preferred from the point of higher sensitization that the liquid substance has the solubility in water of 10 g or more at 25° C. It is also preferred that the SP value by Okitsu method of the liquid substance is 20 or more from the point of compatibility with the binder. Okitsu method is described in detail in *Nippon Setchaku Gakkai-Shi "Bulletin of the Adhesion Society of Japan*", Vol. 20, No. 5 (1993).

The liquid substance is not particularly restricted so long as the above conditions are satisfied, e.g., the liquid substance may be a solvent for preparing the coating solution of the light-to-heat converting layer, may be an additive, or may be other substances. Further, for example, in the case where the liquid substance is a solvent, the liquid substance may be added aggressively, but even if the liquid substance is not added aggressively, the solvent used for preparing the coating solution of the light-to-heat converting layer may be left for use as the liquid substance by adjusting the drying condition after coating the coating solution.

As the solvents which can be used as the liquid substance, various solvents described later as the solvents for preparing the coating solution of the light-to-heat converting layer can be exemplified and, above all, N-methyl-2-pyrrolidone, N-dimethylacetamide, lactone compounds and pyrrolidone derivatives are preferably used.

In the present invention, the ratio of the optical density (OD) to the layer thickness (μm unit) of the image-forming layer, OD/layer thickness, is preferably 1.80 or more. The optical density used here is the reflection optical density obtained by transferring the image having been transferred from the thermal transfer sheet to the image-receiving sheet further to actual Tokuryo art paper, and measuring each color of yellow (Y), magenta (M), cyan (C) and black (K) by Y, M, C and K modes respectively with a densitometer (X-rite 938, manufactured by X-rite Co.). The layer thickness of the image-forming layer is measured in μm by observing the cross section of the thermal transfer sheet before image-recording with a scanning electron microscope.

When OD/layer thickness is 1.80 or more, not only the image density required of a printing proof can be easily obtained but an image-forming layer can be made thin, and so the transfer of an image to an image-receiving layer can be performed efficiently, the rupturing property of the image-forming layer is stable, and the dot shapes can be made sharp, as a result, the follow-up after high resolution recording and excellent dot reproduction corresponding to image data can be made possible. Further, since an image-forming layer can be made thinner, the influences of ambient temperature and humidity can be reduced to the utmost, the repeating reproducibility of an image can be improved, stable transfer peeling property can be obtained, and a proof which is higher in approximation to the printed matter can be formed. Further, by making OD/layer thickness 2.50 or more, transfer density and resolution can be widely increased.

When OD/layer thickness is less than 1.80, sufficient image density cannot be obtained, or the rupturing property of an image-forming layer is inferior and the resolution is reduced, thus a good image cannot be obtained at all events.

It is preferred in the present invention to make the contact angle of the image-receiving layer in the image-receiving sheet with water 86° or less. Sufficient adhesive strength can be obtained at image formation, and a sharp dot shape can be obtained, as a result, excellent dot reproduction corresponding to image data can be made possible by making the contact angle 86° or less. Further, a proof of high quality with no defects can be formed without causing transfer failure when an image is transferred to an actual printing paper. The contact angle with water of the image-receiving layer with water in the present invention is a value obtained by measuring with a contact angle meter CA-A (manufactured by Kyowa Kaimen Kagaku Co., Ltd.).

The present invention realizes a thermal transfer image by sharp dots and is effective and suitable for a system capable of transferring an image to an actual printing paper and a recording size of B2 or more (preferably 515 mm×728 mm or more (B2 size is 543 mm×765 mm), and more preferably 594 mm×841 mm or more).

The thermal transfer image obtained by such a system has resolution of 2,400 dpi or more, and preferably 2,600 dpi or more, and a dot image corresponding to print line number can be formed. Since an individual dot obtained is very sharp and almost free of blur and chip, dots of a wide range from highlight to shadow can be clearly formed. As a result, it is possible to output dots of high grade having the same resolution as those obtained by an image setter and a CTP setter, and so dots and gradation which are excellent in approximation to the printed matters can be reproduced.

Since the thermal transfer image obtained by this system is sharp in dot shape, dots corresponding to laser beams can be faithfully reproduced and the dependence on the ambient temperature and humidity of the recording characteristics is very small. Accordingly, repeating reproducibility stable in hue and density can be obtained under wide temperature and humidity conditions.

Since the thermal transfer image is formed with coloring pigments used in printing inks and excellent in repeating reproducibility, highly minute CMS (color management system) can be realized.

Further, the thermal transfer image can almost coincide with the hues of Japan color and SWOP color, i.e., the hues of printed matters, and the colors appear similarly to the printed matters even when light sources of illumination are changed, e.g., a fluorescent lamp, an incandescent lamp.

Since the thermal transfer image is sharp in dot shape, the fine line of a fine character can be reproduced sharply. Heat generated by laser beams is not diffused in the surface direction and conducted up to the transfer interface, and the image-forming layer ruptures sharply at interface of heating area/non-heating area. Thinning of the light-to-heat converting layer in the thermal transfer sheet and dynamic properties of the image-forming layer are controlled for this purpose.

A light-to-heat converting layer is presumed from simulation to reach about 700° C. in a moment, and a thin layer is liable to be deformed and ruptured at that high temperature. When deformation and rupturing occur, a light-to-heat converting layer is transferred to an image-receiving sheet together with the transferred layer or the transferred image becomes uneven. On the other hand, it is necessary to add a light-to-heat converting material in high concentration to a light-to-heat converting layer for obtaining a desired temperature, which results in a problem of precipitation or migration of the dye to the contiguous layer.

Therefore, it is preferred to make a light-to-heat converting layer as thin as about 0.5 μm or less by selecting an infrared absorbing dye excellent in light-to-heat converting characteristics and a heat-resisting binder such as polyimide compounds.

In general, when a light-to-heat converting layer is deformed or an image-forming layer itself is deformed due to high temperature, thickness unevenness is caused in the image-forming layer transferred to an image-receiving layer corresponding to the by-scanning pattern of laser beams, as a result the image becomes uneven and apparent transfer density is reduced. The thinner the thickness of an image-forming layer, the more conspicuous is this tendency. On the other hand, when the thickness of an image-forming layer is thick, dot sharpness is impaired and sensitivity decreases.

To reconcile these reciprocal properties, it is preferred to improve transfer unevenness by adding a material having a low melting point to an image-forming layer, e.g., a wax. Transfer unevenness can also be improved by adding inorganic fine particles in place of a binder to adjust the layer thickness of an image-forming layer properly so that the image-forming layer ruptures sharply at the interface of heating area/non-heating area while maintaining dot sharpness and sensitivity.

In general, materials having a low melting point, such as waxes, are liable to ooze to the surface of an image-forming layer or to be crystallized and cause a problem in image quality and the aging stability of a thermal transfer sheet in some cases.

To cope with this problem, it is preferred to use a low melting point material having no great difference from the polymer of an image-forming layer in an SP value, by which the compatibility with the polymer can be increased and the separation of the low melting point material from the image-forming layer can be prevented. It is also preferred to mix several kinds of low melting point materials each having different structure by eutectic mixture to prevent crystallization. As a result, an image showing a sharp dot shape and free of unevenness can be obtained.

Further, the dynamic properties and thermal physical properties of the coated layer of a thermal transfer sheet is generally varied by absorbing moisture, thus the humidity dependence of recording atmosphere is caused.

For reducing the temperature and humidity dependence, it is preferred that the dye/binder system of a light-to-heat converting layer and the binder system of an image-forming layer be made organic solvents. It is also preferred to use polyvinyl butyral as the binder of an image-receiving layer and to introduce a hydrophobitization technique of polymers for the purpose of lowering water absorption properties of polymers. As the hydrophobitization technique of polymers, the techniques of reacting a hydroxyl group with a hydrophobic group, or crosslinking two or more hydroxyl groups with a hardening agent as disclosed in JP-A-8-238858 can be exemplified.

About 500° C. or more heat is also generally applied to an image-forming layer by laser exposure imaging, and so some of conventionally used pigments are heat-decomposed, but this problem can be prevented by using highly heat-resisting pigments in an image-forming layer.

For preventing the variation of hue due to migration of an infrared absorbing dye from a light-to-heat converting layer to an image-forming layer by high heat at exposure, it is preferred to design a light-to-heat converting layer by combinations of highly retentive infrared absorbing dyes and binders as described above.

Shortage of energy occurs generally in high speed printing and, in particular, gaps corresponding to intervals of laser by-scanning are generated. As described above, using a dye in high concentration in a light-to-heat converting layer and thinning of a light-to-heat converting layer and an image-forming layer can improve the efficiency of generation and conduction of heat. It is also preferred to add a low melting point material to an image-forming layer for the purpose of slightly fluidizing the image-forming layer at heating to thereby fill the gaps and improving the adhesion with the image-receiving layer. Further, for enhancing the adhesion of an image-receiving layer and an image-forming layer and sufficiently strengthening a transferred image, it is preferred to use the same polyvinyl butyral as used in the image-forming layer as the binder in the image-receiving layer.

It is preferred that an image-receiving sheet and a thermal transfer sheet are retained on a drum by vacuum adhesion. Since an image is formed by the adhesion control of both sheets, image transfer behavior is very sensitive to the clearance between the image-receiving layer surface in an image-receiving sheet and the image-forming layer surface in a transfer sheet, hence vacuum adhesion is important. If the clearance between the materials is widened due to foreign matter, e.g., dust, as a cue, image defect and image transfer unevenness come to occur.

For preventing such image defect and image transfer unevenness, it is preferred to give uniform unevenness to a thermal transfer sheet to thereby improve the air passage, to obtain uniform clearance.

For giving unevenness to a thermal transfer sheet, a method of post treatment such as embossing treatment and a method of the addition of a matting agent to a coating layer are generally used, but in view of the simplification of manufacturing process and stabilization of materials with the lapse of time, the addition of a matting agent is preferred. The particle size of a matting agent must be larger than the coating layer thickness. When a matting agent is added to an image-forming layer, there arises a problem of coming out of the image of the part where the matting layer is present, accordingly, it is preferred to add a matting agent having an optimal particle size to a light-to-heat converting layer, thereby the layer thickness of an image-forming layer itself becomes almost uniform and an image free of defect can be obtained on an image-receiving sheet.

For surely reproducing sharp dots as described above, a recording unit is also required to be designed highly precisely. The recording unit for use in laser thermal transfer in the present invention is the same as those conventionally used in fundamental constitution. The constitution is a so-called heat mode outer drum recording system wherein recording is performed such that recording head provided with a plurality of high power lasers emits laser rays on a thermal transfer sheet and an image-receiving sheet fixed on a drum. A preferred embodiment is as follows.

Feeding of an image-receiving sheet and a thermal transfer sheet is performed by full automatic roll feeding. Fixing of an image-receiving sheet and a thermal transfer sheet on a recording drum is performed by vacuum suction. Many vacuum suction holes are formed on a recording drum, and a sheet is sucked by the drum by reducing the pressure in the drum with a blower or a decompression pump. Since a thermal transfer sheet is further sucked over the sucked image-receiving sheet, the size of the thermal transfer sheet is made larger than the size of the image-receiving sheet. The air between the thermal transfer sheet and the image-receiving sheet which most affects recording performance is sucked from the area outside of the image-receiving sheet where the thermal transfer sheet is alone.

In the apparatus in the present invention, a great number of sheets of a large size, such as a B2 size, are to be accumulated on a discharge platform. Therefore, a method of floating the sheet discharged later by blasting air between both sheets is used in the present invention.

Figure 2:
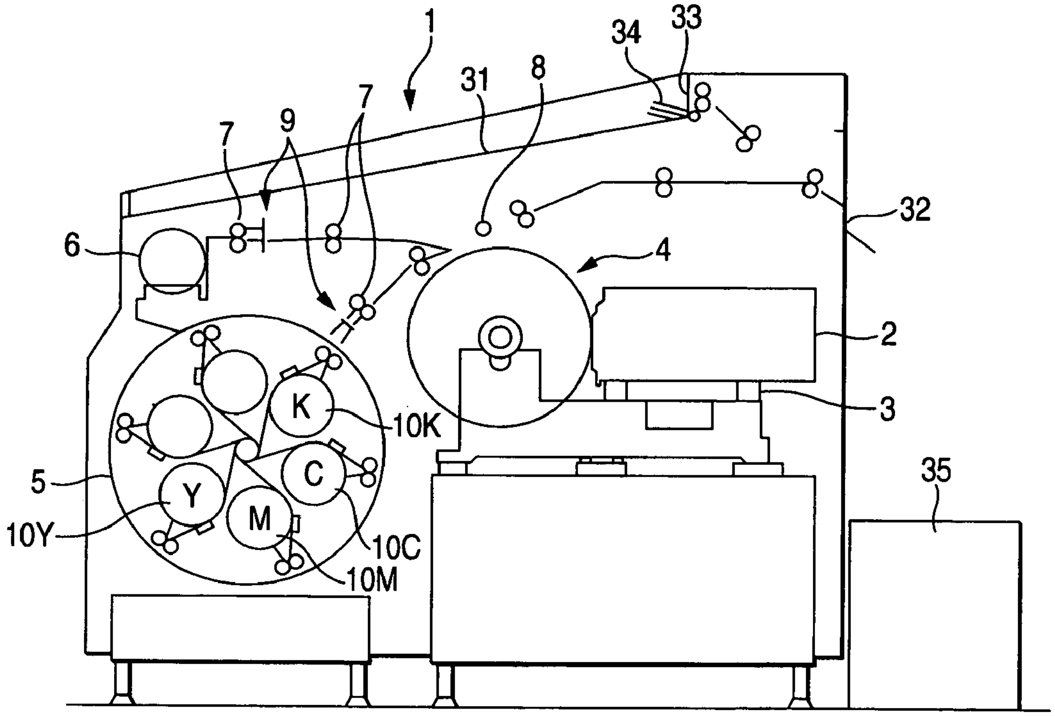
FIG. 2 is a drawing showing an example of constitution of a recording unit for laser thermal transfer.

An example of the constitution of the apparatus in the present invention is shown in FIG. 2.

The sequence of the apparatus in the present invention as above is described below.

1) By-scan axis of recording head 2 of recording unit 1 is reset by by-scan rail 3, main scan rotation axis of recording drum 4 and thermal transfer sheet loading unit 5 are reset at origin.

2) Image-receiving sheet roll 6 is unrolled by carrier roller 7, and the tip of the image-receiving roll is fixed on recording drum 4 by vacuum suction via suction holes provided on the recording drum.

3) Squeeze roller 8 comes down on recording drum 4 and presses the image-receiving sheet, and when the prescribed amount of the image-receiving sheet is conveyed by the rotation of the drum, the sheet is stopped and cut by cutter 9 in a prescribed length.

4) Recording drum 4 further makes a round, thus the loading of the image-receiving sheet finishes.

5) In the next place, in the same sequence as the image-receiving sheet, thermal transfer sheet K of the first color, black, is drawn out from thermal transfer sheet roll 10K, cut and loaded.

6) Recording drum 4 begins high speed rotation, recording head 2 on by-scan rail 3 begins to move and when reaches the starting position of recording, recording laser is emitted on recording drum 4 by recording head 2 according to recording signals. Irradiation finishes at finishing position of recording, operation of by-scan rail and drum rotation finish. The recording head on the by-scan rail is reset.

7) Only thermal transfer sheet K is released with the image-receiving sheet remaining on the recording drum. For the releasing, the tip of thermal transfer sheet K is caught by the claw, pulled out in the discharge direction, and discarded from discard port 32 to discard box 35.

8) The procedures of 5) to 7) are repeated for the remaining three colors. Recording is performed in the order of black, cyan, magenta and yellow. That is, thermal transfer sheet C of the second color, cyan, is drawn out from thermal transfer sheet roll 10C, thermal transfer sheet M of the third color, magenta, from thermal transfer sheet roll 10M, and thermal transfer sheet Y of the fourth color, yellow, from thermal transfer sheet roll 10Y in order. This is the inverse of general printing order, since the order of the colors on actual paper becomes inverse by the later process of transfer to actual paper.

9) After recording of four colors, the recorded image-receiving sheet is finally discharged to discharge platform 31. The releasing method from the drum is the same as that of the thermal transfer sheet in above 7), but since the image-receiving sheet is not discarded unlike the thermal transfer sheets, the image-receiving sheet is returned to the discharge platform by switch back when conveyed to discard port 32. When the image-receiving sheet is discharged to the discharge platform, air 34 is blasted from under discharge port 33 to make it possible to accumulate a plurality of sheets.

It is preferred to use an adhesive roller provided with an adhesive material on the surface as carrier roller 7 of either a feeding part or a carrying part of the thermal transfer sheet roll and the image-receiving sheet roll.

The surfaces of the thermal transfer sheet and the image-receiving sheet can be cleaned by providing an adhesive roller.

As adhesive materials which are used for adhesive rollers, e.g., an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic ester copolymer, a polyester resin, a polyurethane resin, an acrylate resin, a butyl rubber, and a polynorbornene can be exemplified.

An adhesive roller can clean the surfaces of a thermal transfer sheet and an image-receiving sheet by being brought into contact with the surfaces of them, and the contact pressure is not particularly limited so long as they are in contact with the adhesive roller.

Vickers hardness Hv of the material having viscosity for use in an adhesive roller is preferably 50 kg/mm$^2$ (=about 490 MPa) or less in view of capable of sufficiently removing foreign matters and suppressing image defect.

Vickers hardness is the hardness obtained by measurement with applying static load to a regular pyramid indenter of diamond having the angle between the opposite faces of 136°, and Vickers hardness Hv can be obtained by the following equation:

$$\text{Hardness } Hv = 1.854\ P/d^2\ (\text{kg/mm}^2) = \text{about } 18.1692\ P/d^2\ (\text{MPa})$$

wherein P: load (kg), d: the length of diagonal line of the square of depressed area (mm).

It is also preferred in the present invention that the modulus of elasticity at 20° C. of the material having viscosity for use in the above adhesive roller is 200 kg/cm$^2$ (=about 19.6 MPa) or less in view of capable of sufficiently removing foreign matters and suppressing image defect similarly to the above.

It is preferred that the absolute value of the difference between the surface roughness Rz of the front face of the image-forming layer in the thermal transfer sheet and the surface roughness Rz of the back face of the image-forming layer is 3.0 or less, and the absolute value of the difference between the surface roughness Rz of the front face of the image-receiving layer in the image-receiving sheet and the surface roughness Rz of the back face of the image-receiving layer is 3.0 or less. By such constitution of the present invention, conjointly with the above cleaning means, image defect can be prevented, jamming in carrying can be done away with, and dot gain stability can be improved.

The surface roughness Rz in the present invention means ten point average surface roughness corresponding to Rz of JIS (maximum height). The surface roughness is obtained by inputting and computing the distance between the average value of the altitudes of from the highest peak to the fifth peak and the average value of the depths of from the deepest valley to the fifth valley with the average surface of the part obtained by removing by the reference area from the curved surface of roughness as the reference level. A feeler type three dimensional roughness meter (Surfcom 570A-3DF, manufactured by Tokyo Seimitsu Co., Ltd.) is used in measurement. The measurement is performed in machine direction, the cutoff value is 0.08 mm, the measured area is 0.6 mm×0.4 mm, the feed pitch is 0.005 mm, and the speed of measurement is 0.12 mm/sec.

For further improving the above effects, it is more preferred that the absolute value of the difference between the surface roughness Rz of the front surface of the image-forming layer in the thermal transfer sheet and the surface roughness Rz of the back surface of the image-forming layer is 1.0 or less, and the absolute value of the difference between the surface roughness Rz of the front surface of the image-receiving layer in the image-receiving sheet and the surface roughness Rz of the back surface of the image-receiving layer is 1.0 or less.

Further, as another embodiment, it is preferred that the surface roughness Rz of the front surface and the back surface of the image-forming layer in the thermal transfer sheet and/or the surface roughness Rz of the front surface and the back surface of the image-receiving sheet is from 2 to 30 μm. By such constitution of the present invention, conjointly with the above cleaning means, image defect can be prevented, jamming in carrying can be done away with, and dot gain stability can be improved.

It is also preferred that the glossiness of the image-forming layer in the thermal transfer sheet is from 80 to 99.

The glossiness largely depends upon the surface smoothness of the image-forming layer and can affect the uniformity of the layer thickness of the image-forming layer. When the glossiness is higher, the image-forming layer becomes more uniform and more preferred for highly minute use, but when the smoothness is high, the resistance at conveying becomes larger, thus they are in relationship of trade off. When the glossiness is from 80 to 99, both are compatible and well-balanced.

Figure 1B:
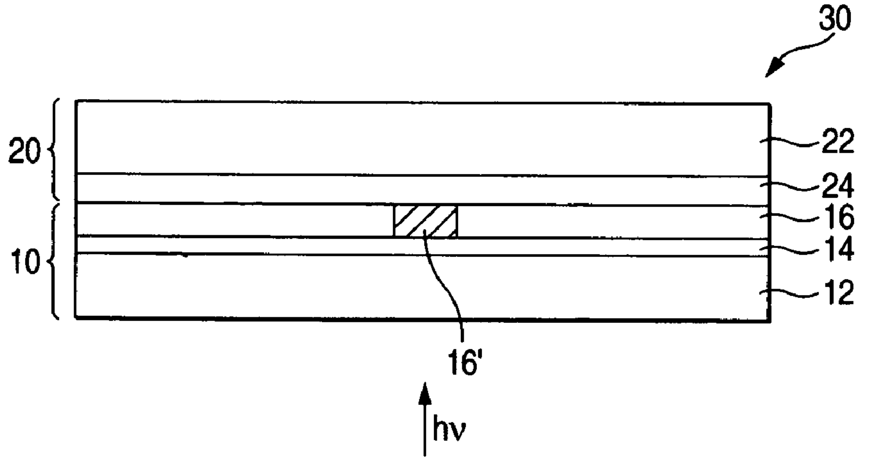
Figure 1C:
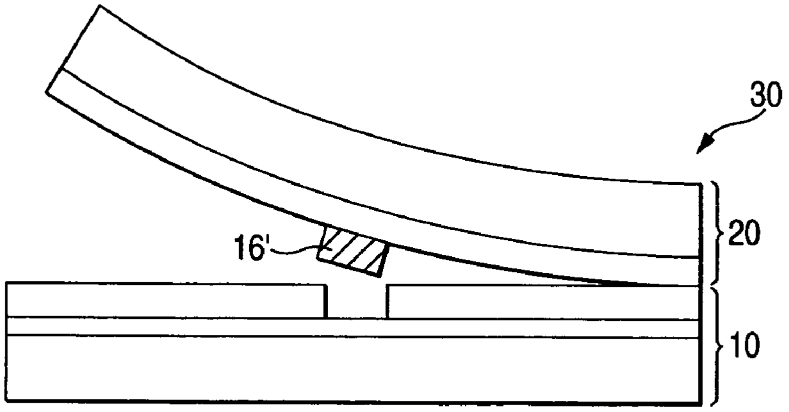

The scheme of multicolor image-forming by membrane thermal transfer using a laser is outlined with referring to FIG. 1.

Laminate 30 for image formation comprising image-receiving sheet 20 laminated on the surface of image-forming layer 16 containing pigment black (K), cyan (C), magenta (M) or yellow (Y) in thermal transfer sheet 10 is prepared. Thermal transfer sheet 10 comprises support 12, having provided thereon light-to-heat converting layer 14 and further thereon image-forming layer 16, and image-receiving sheet 20 comprises support 22 and having provided thereon image-receiving layer 24, and image-receiving layer 24 is laminated on the surface of image-forming layer 16 in thermal transfer sheet 10 in contact therewith (FIG. 1(*a*)). When laser beams are emitted imagewise in time series from the side of support 12 in thermal transfer sheet 10 of laminate 30, the irradiated area with laser beams of light-to-heat converting layer 14 in thermal transfer sheet 10 generates heat, thereby the adhesion strength with image-forming layer 16 is reduced (FIG. 1(*b*)). Thereafter, when image-receiving sheet 20 and thermal transfer sheet 10 are peeled off, the area 16' irradiated with laser beams of image-forming layer 16 is transferred to image-receiving layer 24 in image-receiving sheet 20 (FIG. 1(*c*)).

In multicolor image formation, the laser beam for use in irradiation preferably comprises multi-beams, particularly preferably comprises multi-beams of two-dimensional array. Multi-beams of two-dimensional array means that a plurality of laser beams are used when recording by irradiation with laser beam is performed, and the spot array of these laser beams contains two-dimensional array containing a plurality of rows along the main scanning direction and a plurality of rows along the by-scanning direction.

The time required in laser recording can be shortened by using multi-beams of two-dimensional array.

Any laser beam can be used in recording with no limitation so long as it is comprised of multi-beams, such as gas laser beams, e.g., argon ion laser beams, helium neon laser beams, and helium cadmium laser beams, solid state laser beams, e.g., YAG laser beams, and direct laser beams, e.g., semiconductor laser beams, dye laser beams and excimer laser beams, can be used. Alternatively, laser beams obtained by converting these laser beams to half the wavelength through second harmonic generation elements can also be used. In multicolor image formation, semiconductor laser beams are preferably used taking the output power and easiness of modulation into consideration. In multicolor image formation, it is preferred that laser beam emission is performed on conditions that the beam diameter of laser beam on the light-to-heat converting layer is from 5 to 50 μm (in particular from 6 to 30 μm), and scanning speed is preferably 1 m/second or more (particularly preferably 3 m/second or more).

In addition, it is preferred in multicolor image formation that the layer thickness of the image-forming layer in the black thermal transfer sheet is larger than the layer thickness of the image-forming layer in each of yellow, magenta and cyan thermal transfer sheets, and is preferably from 0.5 to 0.7 μm. By adopting this constitution, the reduction of density due to transfer unevenness by the irradiation of the black thermal transfer sheet with laser beams can be suppressed.

When the layer thickness of the image-forming layer in the black thermal transfer sheet is less than 0.5 μm, image density is largely reduced in some cases due to transfer unevenness by high energy recording, thus it is difficult to obtain required image density as the proof of printing. Since this tendency becomes more conspicuous under high humidity conditions, density variation due to surrounding conditions sometimes becomes too great. On the other hand, when the layer thickness is more than 0.7 μm, transfer sensitivity is reduced at recording time by laser and impression of small dots and fine lines is sometimes deteriorated. This tendency becomes more conspicuous under low humidity conditions. Resolution often lowers when the layer thickness of the image-forming layer is not within the above range. The layer thickness of the image-forming layer in the black thermal transfer sheet is more preferably from 0.55 to 0.65 μm and particularly preferably 0.60 μm.

It is further preferred that the layer thickness of the image-forming layer in the above black thermal transfer sheet is from 0.5 to 0.7 μm, and the layer thickness of the image-forming layers in each of the above yellow, magenta and cyan thermal transfer sheets is from 0.2 to less than 0.5 μm.

When the layer thickness of each image-forming layer in yellow, magenta and cyan thermal transfer sheets is less than 0.2 μm, image density is liable to lower due to transfer unevenness when recording is performed by laser irradiation. On the other hand, when the layer thickness is 0.5 μm or more, the reduction of transfer sensitivity and the deterioration of resolution are sometimes caused. The layer thickness of each image-forming layer in yellow, magenta and cyan thermal transfer sheets is more preferably from 0.3 to 0.45 μm.

It is preferred that the image-forming layer in the black thermal transfer sheet should contain carbon black, and the carbon black preferably comprises at least two carbon blacks each having different tinting strength from the viewpoint of capable of controlling reflection density with maintaining P/B (pigment/binder) ratio in a specific range.

The tinting strength of carbon black is represented variously, e.g., PVC blackness disclosed in JP-A-10-140033, can be exemplified. PVC blackness is the evaluation of blackness, i.e., carbon black is added to PVC resin, dispersed by a twin roll mill and made to a sheet, and the blackness of a sample is evaluated by visual judgement, with taking the blackness of Carbon Black #40 and #45 (manufactured by Mitsubishi Chemicals Co., Ltd.) as 1 point and 10 points respectively as the standard values. Two or more carbon blacks having different PVC blacknesses can be used arbitrarily according to purposes.

The specific producing method of a sample is described below.

Producing Method of Sample

In a banbury mixer having a capacity of 250 ml, 40 mass % of sample carbon black is compounded to an LDPE (low density polyethylene) resin and kneaded at 115° C. for 4 minutes.

Compounding Condition

| | |
|---|---|
| LDPE resin | 101.89 g |
| Calcium stearate | 1.39 g |
| Irganox ® 1010 | 0.87 g |
| Sample carbon black | 69.43 g |

In the next place, the above compound is diluted in a twin roll mill at 120° C. so as to reach the concentration of carbon black of 1 mass %.

Preparation Condition of Diluted Compound

| | |
|---|---|
| LDPE resin | 58.3 g |
| Calcium stearate | 0.2 g |

Resin compounded with 40 mass % of carbon black 1.5 g

The above-prepared product is made to a sheet having a slit width of 0.3 mm, the sheet is cut to chips, and a film having a thickness of 65±3 μm is formed on a hot plate at 240° C.

A multicolor image may be formed, as described above, by the method of using the thermal transfer sheets, and repeatedly superposing many image layers (an image-forming layer on which an image is formed) on the same one image-receiving sheet, alternatively a multicolor image may be formed by the method of forming images on a plurality of image-receiving sheets once, and then transferring these images to an actual paper.

With the latter case, for example, thermal transfer sheets having image-forming layers each containing a coloring material mutually different in hue are prepared, and independently four kinds (cyan, magenta, yellow, black) of laminates for image-forming each comprising the above thermal transfer sheet combined with an image-receiving sheet are produced. Laser irradiation according to digital signal on the basis of the image is performed to each laminate through a color separation filter, subsequently the thermal transfer sheet and the image-receiving sheet are peeled off, to thereby form independently a color-separated image of each color on each image-receiving sheet. Thereafter, the thus-formed each color-separated image is laminated in sequence on an actual support, such as actual printing paper prepared separately, or on a support approximates thereto, thus a multicolor image can be formed.

Thermal transfer recording which utilizes laser beam irradiation is not particularly restricted with respect to pigments and dyes at the time of transferring, and the change of the state of an image-forming layer, including a solid state, a softened state, a liquid state and a gas state, preferably a solid state and a softened state, so long as the thermal transfer recording is capable of converting laser beams to heat and transferring an image-forming layer containing a pigment on an image-receiving sheet using the above converted heat energy and forming an image on the image-receiving sheet. Conventionally well-known fusion transfer, ablation transfer and sublimation transfer also belong to the thermal transfer recording utilizing laser beam irradiation.

The above-described membrane transfer, fusion transfer and ablation transfer are preferred in the point of capable of forming an image of a hue analogous to the printed matter.

Further, a heat laminator is generally used in the process for transferring an image-receiving sheet printed with an image in a recording unit to an actual printing paper (referred to as "actual paper"). An image-receiving sheet and an actual paper are superposed and heat and pressure are applied, thereby the image-receiving sheet and the actual paper are adhered, and then the image-receiving sheet is peeled off the actual paper, as a result only the image-receiving sheet having an image is left on the actual paper.

By connection the above unit with a plate-making system, a system capable of exhibiting the function as color proof is constructed. As the system, it is necessary that a printed matter having an image quality approximating as far as possible to the printed matter outputted from certain plate-making data must be outputted from the recording unit. Therefore, a software for approximating dots and colors to a printed matter is necessary. The specific example of connection is described below.

When the proof of a printed matter is obtained from a plate-making system (e.g., Celebra, manufactured by Fuji Photo Film Co., Ltd.), the system connection is as follows. CTP (computer to plate) system is connected with the plate-making system. The final printed matter can be obtained by mounting the printing plate outputted from this system on a printing press. As a color proof, the above recording unit is connected with the plate-making system, and as a proof drive software for approximating dots and colors to the printed matter, PD system (registered trademark) is connected with the plate-making system.

Contone data (continuous tone data) converted to raster data by the plate-making system are converted to binary data for dots and outputted to CTP system and finally subjected to printing. On the other hand, the same contone data are also outputted to PD system. PD system converts the received data according to four dimensional (black, cyan, magenta and yellow) table so that the colors coincide with the printed matter, and finally converts the data to binary data for dots so that the dots coincide with the dots of the printed matter and the data is outputted to the recording unit.

The four dimensional table is experimentally prepared in advance and saved in the system. The experiment for the preparation of the four dimensional table is as follows. The printed image of important color data via CTP system and the outputted image of important color data from the recording unit via PD system are prepared, the measured color values of these images are compared and the table is formed so that the difference becomes minimum.

A thermal transfer sheet and an image-receiving sheet which are preferably used in the recording unit of the above system are described below.

Thermal Transfer Sheet

A thermal transfer sheet comprises a support having thereon at least a light-to-heat converting layer and an image-receiving layer, and, if necessary, other layers.

Support

The materials of the support of a thermal transfer sheet are not particularly restricted, and various supports can be used according to purpose. The support preferably has stiffness, good dimensional stability, and heat resistance capable of resisting the heat at image formation. The preferred examples of the materials of the support include synthetic resin materials, e.g., polyethylene terephthalate, polyethylene-2,6-naphthalate, polycarbonate, polymethyl methacrylate, polyethylene, polypropylene, polyvinyl chloride, polyvinylidene chloride, polystyrene, a styrene-acrylonitrile copolymer, polyamide (aromatic or aliphatic), polyimide, polyamideimide, and polysulfone. Biaxially stretched polyethylene terephthalate is preferred above all from the viewpoint of mechanical strength and dimensional stability against heat. When resins are used in the preparation of color proofs utilizing laser recording, the support of a thermal transfer sheet is preferably formed from transparent synthetic resins which transmit laser beams. The thickness of the support is preferably from 25 to 130 μm, particularly preferably from 50 to 120 μm. The central line average surface roughness Ra of the support of the side on which an image-forming layer is provided is preferably less than 0.1 μm (the value obtained by measurement with Surfcom, manufactured by Tokyo Seiki Co., Ltd., according to JIS B0601). The Young's modulus of the support in the machine direction is preferably from 200 to 1,200 $kg/mm^2$ (=about 2 to 12 GPa), and the Young's modulus of the support in the transverse direction is preferably from 250 to 1,600 $kg/mm^2$ (about 2.5 to 16 GPa). The F-5 value of the support in the machine direction is preferably from 5 to 50 $kg/mm^2$ (=about 49 to 490 MPa), and the F-5 value of the support in the transverse direction is preferably from 3 to 30 $kg/mm^2$ (=about 29.4 to 294 MPa); and the F-5 value of the support in the machine direction is generally higher than the F-5 value of the support in the transverse direction, but when it is necessary to make the strength particularly in the transverse direction high, this rule does not apply to the case. Further, the heat shrinkage at 100° C. for 30 minutes of the support in the machine direction and the transverse direction is preferably 3% or less, more preferably 1.5% or less, the heat shrinkage at 80° C. for 30 minutes is preferably 1% or less, more preferably 0.5% or less. The breaking strength is from 5 to 100 $kg/mm^2$ (=about 49 to 980 MPa) in both directions, and the modulus of elasticity is preferably from 100 to 2,000 $kg/mm^2$ (=about 0.98 to 19.6 GPa).

The support of a thermal transfer sheet may be subjected to surface activation treatment and/or one or two or more undercoat layers may be provided on the support for the purpose of improving the adhesion with the light-to-heat converting layer which is provided on the support. As the examples of the surface activation treatments, glow discharge treatment and corona discharge treatment are exemplified. As the materials of the undercoat layer, materials having high adhering property to both surfaces of the support and the light-to-heat converting layer, low heat conductivity, and excellent heat resisting property are preferably used. As the materials of such an undercoat layer, styrene, a styrene-butadiene copolymer and gelatin can be exemplified. The thickness of the undercoat layer is generally from 0.01 to 2 μm as a whole. If necessary, various functional layers such as a reflection-preventing layer and an antistatic layer may be provided on the surface of the support of the thermal transfer sheet of the side opposite to the side on which a light-to-heat converting layer is provided, or the support may be subjected to various surface treatments.

Backing Layer

It is preferred to provide a backing layer on the surface of the support of the thermal transfer sheet of the side opposite to the side on which a light-to-heat converting layer is provided. The backing layer preferably comprises the first backing layer contiguous to the support and the second backing layer provided on the side of the support opposite to the side on which the first backing layer is provided. In the present invention, the ratio of the mass B of the antistatic agent contained in the second backing layer to the mass A of the antistatic agent contained in the first backing layer, B/A, is preferably less than 0.3. When B/A is 0.3 or more, a sliding property and powder dropout resistance of the backing layer are liable to be deteriorated.

The layer thickness C of the first backing layer is preferably from 0.01 to 1 μm, and more preferably from 0.01 to 0.2 μm. The layer thickness D of the second backing layer is preferably from 0.01 to 1 μm, and more preferably from 0.01 to 0.2 μm. The ratio of the layer thickness of the first backing layer to that of the second backing layer, C/D, is preferably from 1/2 to 5/1.

As the antistatic agents for use in the first and second backing layers, compounds such as a nonionic surfactant, e.g., polyoxyethylene alkylamine, and glycerol fatty acid ester; a cationic surfactant, e.g., a quaternary ammonium salt; an anionic surfactant, e.g., alkylphosphate; an ampholytic surfactant and an electrically conductive resin can be used.

Electrically conductive fine particles can also be used as the antistatic agent. The examples of such electrically conductive fine particles include oxides, e.g., ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$ and $MgB_2O_5$; sulfide, e.g., CuS and ZnS; carbide, e.g., SiC, TiC, ZrC, VC, NbC, MoC and WC; nitride, e.g., $Si_3N_4$, TiN, ZrN, VN, NbN and $Cr_2N$; boride, e.g., $TiB_2$, $ZrB_2$, $NbB_2$, $TaB_2$, CrB, MoB, WB and $LaB_5$; silicide, e.g., $TiSi_2$, $ZrSi_2$, $NbSi_2$, $TaSi_2$, $CrSi_2$, $MoSi_2$ and $WSi_2$; metal salts, e.g., $BaCO_3$, $CaCO_3$, $SrCO_3$, $BaSO_4$ and $CaSO_4$; and complex, e.g., $SiN_4$—SiC and $9Al_2O_3$-$2B_2O_3$. These electrically conductive fine particles may be used alone or in combination of two or more. Of these fine particles, $SnO_2$, ZnO, $Al_2O_3$, $TiO_2$, $In_2O_3$, MgO, BaO and $MoO_3$ are preferred, $SnO_2$, ZnO, $In_2O_3$ and $TiO_2$ are more preferred, and $SnO_2$ is particularly preferred.

When the thermal transfer sheet in the present invention is used in a laser thermal transfer system, the antistatic agent used in the backing layer is preferably substantially transparent so that laser beams can be transmitted.

When electrically conductive metallic oxides are used as the antistatic agent, their particle size is preferably smaller to make light scattering as small as possible, but the particle size should be determined using the ratio of the refractive indices of the particles and the binder as the parameter, which can be obtained according to the theory of Mie. The average particle size of the electrically conductive metallic oxides is generally from 0.001 to 0.5 μm, and preferably from 0.003 to 0.2 μm. The average particle size used herein is the value including not only the particle size of the primary particles of the electrically conductive metallic oxides but the particle size of the particles having higher structure.

Besides an antistatic agent, the first and second backing layers may contain various additives, such as a surfactant, a sliding agent and a matting agent, and a binder. The amount of the antistatic agent contained in the first backing layer is preferably from 10 to 1,000 mass parts per 100 mass parts of the binder, and more preferably from 200 to 800 mass parts. The amount of the antistatic agent contained in the second backing layer is preferably from 0 to 300 mass parts per 100 mass parts of the binder, and more preferably from 0 to 100 mass parts.

As the binders for use for forming the first and second backing layers, homopolymers and copolymers of acrylic acid-based monomers, e.g., acrylic acid, methacrylic acid, acrylic ester and methacrylic ester, cellulose-based polymers, e.g., nitrocellulose, methyl cellulose, ethyl cellulose and cellulose acetate, vinyl-based polymers and copolymers of vinyl compounds, e.g., polyethylene, polypropylene, polystyrene, vinyl chloride-based copolymer, vinyl chloride-vinyl acetate copolymer, polyvinyl pyrrolidone, polyvinyl butyral and polyvinyl alcohol, condensed polymers, e.g., polyester, polyurethane and polyamide, rubber-based thermoplastic polymers, e.g., butadiene-styrene copolymer, polymers obtained by polymerization or crosslinking of photopolymerizable or heat polymerizable compounds, e.g., epoxy compounds, and melamine compounds can be exemplified.

Light-to-Heat Converting Layer

A light-to-heat converting layer may contain a light-to-heat converting material and a binder, and if necessary, a matting agent, and if further necessary, other components.

A light-to-heat converting material is a material having a function of converting irradiated light energy to heat energy. The light-to-heat converting material is in general a dye (inclusive of a pigment, hereinafter the same) capable of absorbing a laser beam. When image-recording is performed by infrared laser, it is preferred to use an infrared-absorbing dye as the light-to-heat converting material. As the examples of the dyes, black pigments, e.g., carbon black, pigments of macrocyclic compounds having absorption in the visible region to the near infrared region, e.g., phthalocyanine and naphthalocyanine, organic dyes which are used as the laser-absorbing material in high density laser recording such as photo-disc, e.g., a cyanine dye such as an indolenine dye, an anthraquinone dye, an azulene dye and a phthalocyanine dye, and organicmetallic compound dyes, e.g., dithiol nickel complex, can be exemplified. Of the above compounds, cyanine dyes are particularly preferably used, since they show a high absorption coefficient to the lights in the infrared region, and the thickness of a light-to-heat converting layer can be thinned when used as the light-to-heat converting material, as a result, the recording sensitivity of a thermal transfer sheet can be further improved.

As the light-to-heat converting material, particulate metallic materials such as blackened silver and inorganic materials can also be used besides dyes.

As the binder to be contained in the light-to-heat converting layer, resins having at least the strength capable of forming a layer on a support and preferably having high heat conductivity. Heat resisting resins which are not decomposed by heat generated from the light-to-heat converting material at image recording are preferably used as the binder resin, since the surface smoothness of the light-to-heat converting layer can be maintained after irradiation even when light irradiation is performed with high energy. Specifically, resins having heat decomposition temperature (the temperature at which the mass decreases by 5% in air current at temperature increasing velocity of 10° C./min by TGA method (thermal mass spectrometry)) of 400° C. or more are preferably used, and more preferably 500° C. or more. The binders preferably have glass transition temperature of from 200 to 400° C., and more preferably from 250 to 350° C. When the glass transition temperature is lower than 200° C., there is a case where fog is generated on the image to be formed, while when it is higher than 400° C., the solubility of the resin is decreased, followed by the reduction of the productivity in some cases.

Further, the heat resistance (e.g., heat deformation temperature and heat decomposition temperature) of the binder in the light-to-heat converting layer is preferably higher than the heat resistance of the materials used in other layers provided on the light-to-heat converting layer.

Specifically, acrylic acid resins, e.g., polymethyl methacrylate, vinyl resins, e.g., polycarbonate, polystyrene, vinyl chloride-vinyl acetate copolymer and polyvinyl alcohol, polyvinyl butyral, polyester, polyvinyl chloride, polyamide, polyimide, polyamideimide, polyether imide, polysulfone, polyether sulfone, aramid, polyurethane, epoxy resin and urea-melamine resin are exemplified as the binder resins for use in the light-to-heat converting layer. Of these resins, polyimide resin and polyamideimide resin are preferred.

Polyimide resins represented by the following formulae (I) to (VII) are soluble in an organic solvent and they are preferably used, since the productivity of the thermal transfer sheet is improved when they are used. Further, these polyimide resins are preferred also in view of capable of improving the stability of viscosity, long term storage stability and moisture resistance of the coating solution for the light-to-heat converting layer.

(I)

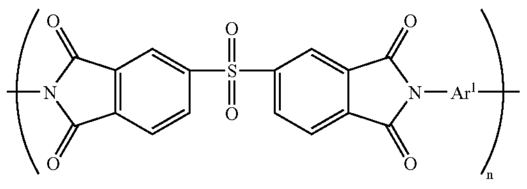

-continued
(II)
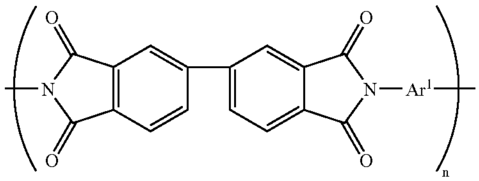
In formulae (I) and (II), $Ar^1$ represents an aromatic group represented by the following formula (1), (2) or (3), and n represents an integer of from 10 to 100.
(1)
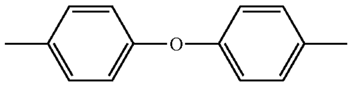
(2)
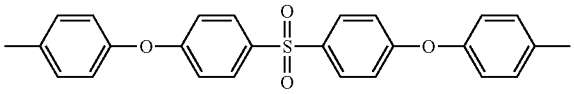
-continued
(3)
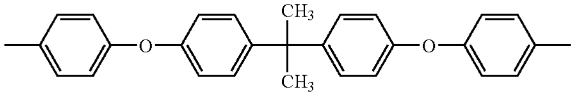
(III)
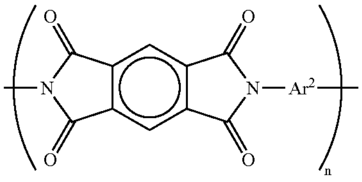
(IV)
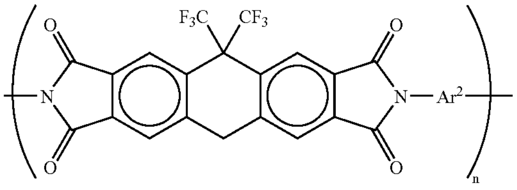
In formulae (III) and (IV), $Ar^2$ represents an aromatic group represented by the following formula (4), (5), (6) or (7), and n represents an integer of from 10 to 100.
(4)
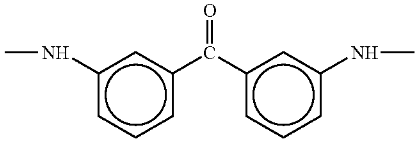
(5)
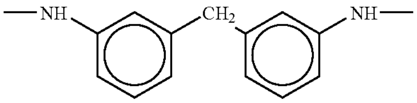
(6)
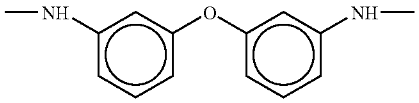
(7)
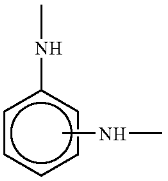
(V)
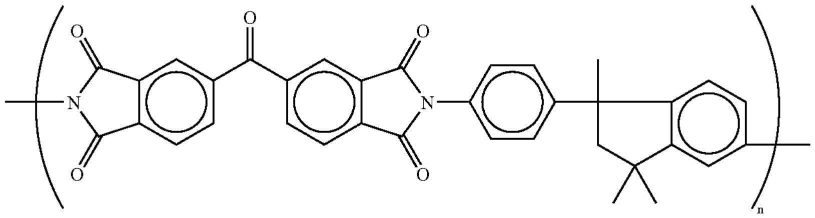
(VI)
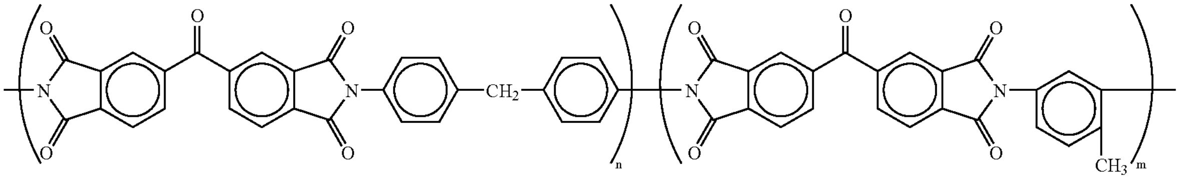

-continued (VII)

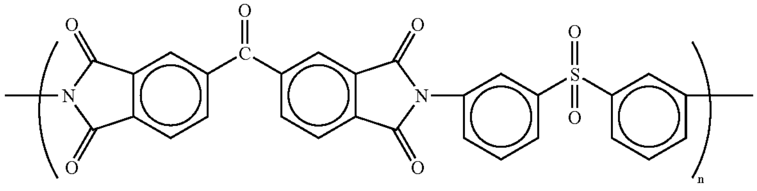

In formulae (V), (VI) and (VII), n and m each represents an integer of from 10 to 100. In formula (VI), the ratio of n/m is from 6/4 to 9/1.

As the criterion whether a resin is soluble in an organic solvent or not, when 10 mass parts or more of the resin is dissolved in 100 mass parts of N-methylpyrrolidone at 25° C., the resin can be preferably used in the light-to-heat converting layer, more preferably 100 mass parts is dissolved in 100 mass parts of N-methylpyrrolidone.

Since a polyamideimide resin has sufficient dynamic strength at high temperature and high retentivity of an infrared-absorbing dye, and is capable of thinning a light-to-heat converting layer, a polyamideimide resin can be preferably used as the binder in a light-to-heat converting layer. By using a polyamideimide resin in combination with an infrared-absorbing dye in a light-to-heat converting layer, the reduction of the absorbance of the coating solution for a light-to-heat converting layer after aging can be prevented, furthermore, the absorbance of the light-to-heat converting layer is increased and sensitivity is improved.

Polyamideimide preferably used in the present invention is polyamideimide represented by the following formula (VIII):

(VIII)

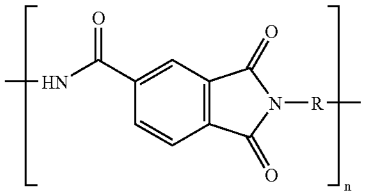

In formula (VIII), R represents a divalent linking group. The preferred specific examples of divalent linking groups are shown below.

(1)

$-(CH_2)_n-$ (n=1~10)

(2)

(3)

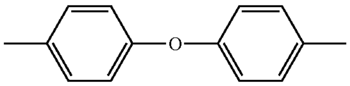

-continued (4)

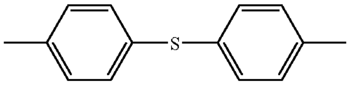

(5)

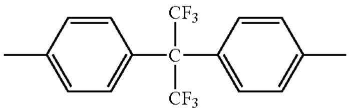

(6)

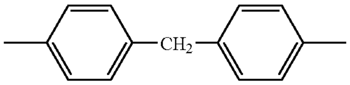

(7)

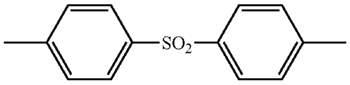

(8)

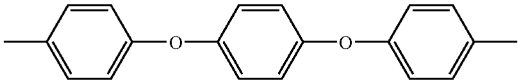

(9)

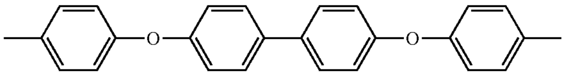

(10)

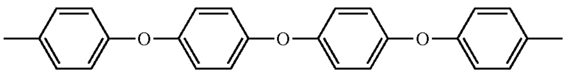

(11)

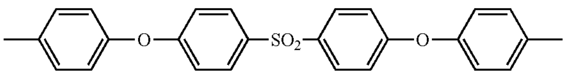

(12)

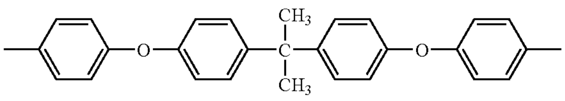

(13)

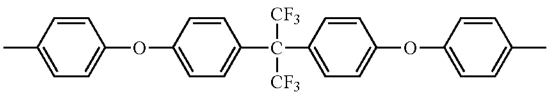

-continued (14)

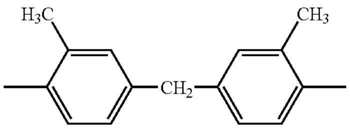

(15)

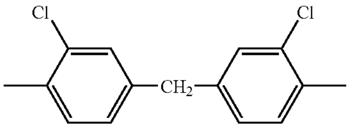

(16)

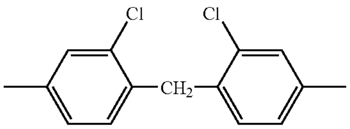

(17)

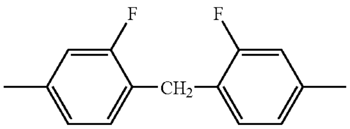

(18)

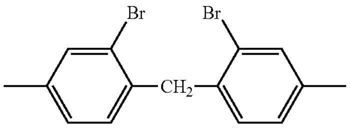

(19)

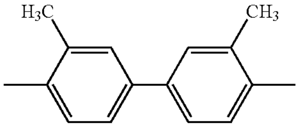

(20)

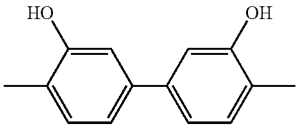

(21)

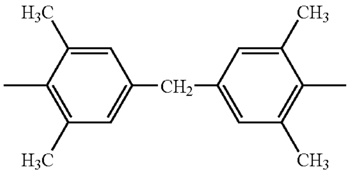

(22)

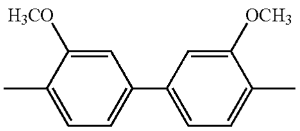

(23)

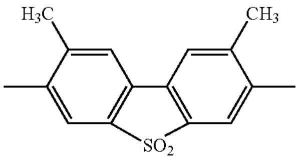

Of the above examples, linking groups (6), (7), (11) and (14) are preferred.

These linking groups may be alone or a plurality of linking groups may be bonded.

The number average molecular weight of polyamideimide represented by formula (VIII) is preferably from 3,000 to 50,000, and more preferably from 10,000 to 25,000, in terms of polystyrene measured by gel permeation chromatography.

As the matting agent contained in the light-to-heat converting layer, inorganic and organic fine particles can be exemplified. The examples of the inorganic fine particles include metal salts, e.g., silica, titanium oxide, aluminum oxide, zinc oxide, magnesium oxide, barium sulfate, magnesium sulfate, aluminum hydroxide, magnesium hydroxide and boron nitride, kaolin, clay, talc, zinc flower, lead white, zeeklite, quartz, diatomaceous earth, pearlite, bentonite, mica and synthetic mica. The examples of the organic fine particles include resin particles, e.g., fluorine resin particles, guanamine resin particles, acrylate resin particles, styrene-acryl copolymer resin particles, silicone resin particles, melamine resin particles and epoxy resin particles.

The matting agents generally have a particle size of from 0.3 to 30 μm, preferably from 0.5 to 20 μm, and the addition amount is preferably from 0.1 to 100 $mg/m^2$.

The light-to-heat converting layer may further contain a surfactant, a thickener, and an antistatic agent, if necessary.

The light-to-heat converting layer can be provided by dissolving a light-to-heat converting material and a binder, adding, if necessary, a matting agent and other components thereto to thereby prepare a coating solution, and coating the coating solution on a support and drying. As the organic solvents for dissolving polyimide resins, e.g., cyclohexanone, 1,4-dioxane, 1,3-dioxane, N-methyl-2-pyrrolidone, dimethyl sulfoxide, dimethylformamide, N-dimethylacetamide and γ-butyrolactone can be exemplified. Coating and drying can be performed according to ordinary coating and drying methods. Drying is generally performed at 300° C. or less, and preferably 200° C. or less. When polyethylene terephthalate is used as the support, the drying temperature is preferably from 80 to 150° C.

If the amount of the binder in the light-to-heat converting layer is not sufficient, the cohesive strength of the light-to-heat converting layer lowers and the light-to-heat converting layer is liable to be transferred together when an image formed is transferred to an image-receiving sheet, which causes color mixture. When the amount of the polyimide resin is too much, the layer thickness of the light-to-heat converting layer becomes too large to achieve a definite absorptivity, thereby sensitivity is liable to be decreased. The mass ratio of the solid content of the light-to-heat converting material to the binder in the light-to-heat converting layer is preferably from 1/20 to 2/1, and particularly preferably from 1/10 to 2/1.

As described above, when the layer thickness of the light-to-heat converting layer is thinned, the sensitivity of the thermal transfer sheet is increased and so preferred. The layer thickness of the light-to-heat converting layer is preferably from 0.03 to 1.0 μm, and more preferably from 0.05 to 0.5 μm. Further, when the light-to-heat converting layer has the optical density ($OD_{LH}$) of from 0.80 to 1.26 to the light having wavelength of 808 nm, the transfer sensitivity of the image-forming layer is improved, and more preferably the optical density ($OD_{LH}$) is from 0.92 to 1.15 to the light having wavelength of 808 nm. When the optical density ($OD_{LH}$) at the laser peak wavelength is less than 0.80, irradiated light cannot be sufficiently converted to heat and sometimes transfer sensitivity is reduced. Contrary to this, when it exceeds 1.26, the function of the light-to-heat converting layer at recording time is affected and sometimes fog is generated.

In the present invention, the optical density ($OD_{LH}$) of the light-to-heat converting layer in the thermal transfer sheet means the absorbance of the light-to-heat converting layer at peak wavelength of the laser beams to be used when the image-forming material of the present invention is subjected to recording, and the optical density can be measured with well-known spectrophotometers. As the spectrophotometer, UV-spectrophotometer UV-240 (manufactured by Shimadzu Seisakusho Co. Ltd.) was used in the present invention. The value obtained by subtracting the optical density of the support alone from the optical density including the support is taken as the above optical density ($OD_{LH}$).

Image-Forming Layer

An image-forming layer contains at least a pigment which is transferred to an image-receiving sheet and forms an image, in addition, a binder for forming the layer and, if necessary, other components.

Pigments are broadly classified to organic pigments and inorganic pigments, and they have respectively characteristics such that the former are particularly excellent in the transparency of the film, and the latter are excellent in shielding property, thus they may be used arbitrarily according to purpose. When the thermal transfer sheet is used for the proof of printing colors, organic pigments which are coincident with yellow, magenta, cyan and black generally used in printing inks or near to these colors in hues are preferably used. Further, metallic powder and fluorescent pigments are also used in some cases. The examples of the pigments which are preferably used include azo pigments, phthalocyanine pigments, anthraquinone pigments, dioxazine pigments, quinacridone pigments, isoindolinone pigments and nitro pigments. The pigments for use in an image-forming layer are listed below by hues, but the present invention is not limited thereto.

1) Yellow Pigment

Pigment Yellow 12 (C.I. No. 21090)

EXAMPLE

Permanent Yellow DHG (manufactured by Clariant Japan, K.K.), Lionol Yellow 1212B (manufactured by Toyo Ink Mfg. Co., Ltd.), Irgalite Yellow LCT (manufactured by Ciba Specialty Chemicals), Symuler Fast Yellow GTF 219 (manufactured by Dainippon Chemicals and Ink Co., Ltd.)

Pigment Yellow 13 (C.I. No. 21100)

EXAMPLE

Permanent Yellow GR (manufactured by Clariant Japan, K.K.), Lionol Yellow 1313 (manufactured by Toyo Ink Mfg. Co., Ltd.)

Pigment Yellow 14 (C.I. No. 21095)

EXAMPLE

Permanent Yellow G (manufactured by Clariant Japan, K.K.), Lionol Yellow 1401-G (manufactured by Toyo Ink Mfg. Co., Ltd.), Seika Fast Yellow 2270 (manufactured by Dainichi Seika K.K.), Symuler Fast Yellow 4400 (manufactured by Dainippon Chemicals and Ink Co., Ltd.)

Pigment Yellow 17 (C.I. No. 21105)

EXAMPLE

Permanent Yellow GG02 (manufactured by Clariant Japan, K.K.), Symuler Fast Yellow 8GF (manufactured by Dainippon Chemicals and Ink Co., Ltd.)

Pigment Yellow 155

EXAMPLE

Graphtol Yellow 3GP (manufactured by Clariant Japan, K.K.)

Pigment Yellow 180 (C.I. No. 21290)

EXAMPLE

Novoperm Yellow P-HG (manufactured by Clariant Japan, K.K.), PV Fast Yellow HG (manufactured by Clariant Japan, K.K.)

Pigment Yellow 139 (C.I. No. 56298)

EXAMPLE

Novoperm Yellow M2R 70 (manufactured by Clariant Japan, K.K.)

2) Magenta Pigment

Pigment Red 57:1 (C.I. No. 15850:1)

EXAMPLE

Graphtol Rubine L6B (manufactured by Clariant Japan, K.K.), Lionol Red 6B-4290G (manufactured by Toyo Ink Mfg. Co., Ltd.), Irgalite Rubine 4BL (manufactured by Ciba Specialty Chemicals), Symuler Brilliant Carmine 6B-229 (manufactured by Dainippon Chemicals and Ink Co., Ltd.)

Pigment Red 122 (C.I. No. 73915)

EXAMPLE

Hosterperm Pink E (manufactured by Clariant Japan, K.K.), Lionogen Magenta 5790 (manufactured by Toyo Ink Mfg. Co., Ltd.), Fastogen Super Magenta RH (manufactured by Dainippon Chemicals and Ink Co., Ltd.)

Pigment Red 53:1 (C.I. No. 15585:1)

EXAMPLE

Permanent Lake Red LCY (manufactured by Clariant Japan, K.K.), Symuler Lake Red C conc (manufactured by Dainippon Chemicals and Ink Co., Ltd.)

Pigment Red 48:1 (C.I. No. 15865:1)

EXAMPLE

Lionol Red 2B-3300 (manufactured by Toyo Ink Mfg. Co., Ltd.), Symuler Red NRY (manufactured by Dainippon Chemicals and Ink Co., Ltd.)

Pigment Red 48:2 (C.I. No. 15865:2)

EXAMPLE

Permanent Red W2T (manufactured by Clariant Japan, K.K.), Lionol Red LX235 (manufactured by Toyo Ink Mfg. Co., Ltd.), Symuler Red 3012 (manufactured by Dainippon Chemicals and Ink Co., Ltd.)

Pigment Red 48:3 (C.I. No. 15865:3)

EXAMPLE

Permanent Red 3RL (manufactured by Clariant Japan, K.K.), Symuler Red 2BS (manufactured by Dainippon Chemicals and Ink Co., Ltd.)

Pigment Red 177 (C.I. No. 65300)

EXAMPLE

Cromophtal Red A2B (manufactured by Ciba Specialty Chemicals)

3) Cyan Pigment

Pigment Blue 15 (C.I. No. 74160)

EXAMPLE

Lionol Blue 7027 (manufactured by Toyo Ink Mfg. Co., Ltd.), Fastogen Blue BB (manufactured by Dainippon Chemicals and Ink Co., Ltd.)

Pigment Blue 15:1 (C.I. No. 74160)

EXAMPLE

Hosterperm Blue A2R (manufactured by Clariant Japan, K.K.), Fastogen Blue 5050 (manufactured by Dainippon Chemicals and Ink Co., Ltd.)

Pigment Blue 15:2 (C.I. No. 74160)

EXAMPLE

Hosterperm Blue AFL (manufactured by Clariant Japan, K.K.), Irgalite Blue BSP (manufactured by Ciba Specialty Chemicals), Fastogen Blue GP (manufactured by Dainippon Chemicals and Ink Co., Ltd.)

Pigment Blue 15:3 (C.I. No. 74160)

EXAMPLE

Hosterperm Blue B2G (manufactured by Clariant Japan, K.K.), Lionol Blue FG7330 (manufactured by Toyo Ink Mfg. Co., Ltd.), Cromophtal Blue 4GNP (manufactured by Ciba Specialty Chemicals), Fastogen Blue FGF (manufactured by Dainippon Chemicals and Ink Co., Ltd.)

Pigment Blue 15:4 (C.I. No. 74160)

EXAMPLE

Hosterperm Blue BFL (manufactured by Clariant Japan, K.K.), Cyanine Blue 700-10FG (manufactured by Toyo Ink Mfg. Co., Ltd.), Irgalite Blue GLNF (manufactured by Ciba Specialty Chemicals), Fastogen Blue FGS (manufactured by Dainippon Chemicals and Ink Co., Ltd.)

Pigment Blue 15:6 (C.I. No. 74160)

EXAMPLE

Lionol Blue ES (manufactured by Toyo Ink Mfg. Co., Ltd.) Pigment Blue 60 (C.I. No. 69800)

EXAMPLE

Hosterperm Blue RL01 (manufactured by Clariant Japan, K.K.), Lionogen Blue 6501 (manufactured by Toyo Ink Mfg. Co., Ltd.)

4) Black Pigment

Pigment Black 7 (Carbon Black C.I. No. 77266)

EXAMPLE

Mitsubishi Carbon Black MA100 (manufactured by Mitsubishi Chemicals Co., Ltd.), Mitsubishi Carbon Black #5 (manufactured by Mitsubishi Chemicals Co., Ltd.), Black Pearls 430 (manufactured by Cabot Co.)

As the pigments which can be used in the present invention, commercially available products can be arbitrarily selected by referring to *Ganryo Binran* (*Pigment Handbook*), compiled by Nippon Ganryo Gijutsu Kyokai, published by Seibundo-Shinko-Sha (1989), and *COLOUR INDEX, THE SOCIETY OF DYES* & *COLOURIST*, Third Ed. (1987).

The average particle size of the above pigments is preferably from 0.03 to 1 μm, and more preferably from 0.05 to 0.5 μm.

When the particle size of the pigments is less than 0.03 μm, the cost for dispersion increases and the dispersion solution sometimes causes gelation, while when the particle size exceeds 1 μm, the coarse particles in the pigments hinder the adhesion of the image-forming layer and the image-receiving layer in some cases, further, the transparency of the image-forming layer is often damaged.

As the binders for the image-forming layer, amorphous organic high polymers having a softening point of from 40 to 150° C. are preferably used. As the amorphous organic high polymers, homopolymers and copolymers of styrene, derivatives thereof, and substitutionproducts thereof, e.g., butyral resin, polyamide resin, polyethyleneimine resin, sulfonamide resin, polyester polyol resin, petroleum resin, styrene, vinyltoluene, α-methylstyrene, 2-methylstyrene, chlorostyrene, vinylbenzoic acid, sodium vinylbenzenesulfonate and aminostyrene, methacrylic esters and methacrylic acid, e.g., methyl methacrylate, ethyl methacrylate, butyl methacrylate, and hydroxyethyl methacrylate, acrylic esters and acrylic acid, e.g., methyl acrylate, ethyl acrylate, butyl acrylate, and α-ethylhexyl acrylate, dienes, e.g., butadiene and isoprene, homopolymers of vinyl monomers or copolymers of vinyl monomers with other monomers, e.g., acrylonitrile, vinyl ethers, maleic acid and maleic esters, maleic anhydride, cinnamic acid, vinyl chloride and vinyl acetate can be used. Two or more of these resins may be used as mixture.

In selecting the binder resins in the image-forming layer and the binder resins in the light-to-heat converting layer, it is preferred to select them so that the difference between the SP values by Okitsu method of the binder resin of both layers is 1.5 or more. When the difference between the SP values by Okitsu method of the binder resin in both layers is 1.5 or more, the adhesion of both layers becomes weak, and the light-to-heat converting layer is prevented from transferring together with the image-forming layer adhered to the image-forming layer at the time of transfer and recording sensitivity is improved.

It is preferred that the image-forming layer contain a pigment in an amount of from 30 to 70 mass %, more and preferably from 30 to 50 mass %. It is also preferred for the image-forming layer to contain a resin in an amount of from 30 to 70 mass %, and more preferably from 40 to 70 mass %.

The image-forming layer can contain the following components (1) to (3) as the above-described other components.

(1) Waxes

The examples of waxes include mineral waxes, natural waxes and synthetic waxes. As the examples of the mineral waxes, petroleum wax such as paraffin wax, microcrystalline wax, ester wax and oxide wax, montan wax, ozokerite and ceresin can be exemplified. Paraffin wax is preferred above all. The paraffin wax is separated from petroleum, and various products are commercially available according to melting points.

As the examples of the natural waxes, vegetable wax, e.g., carnauba wax, Japan wax, ouriculy wax and esparto wax, and animal wax, e.g., beeswax, insect wax, shellac wax and spermaceti can be exemplified.

The synthetic waxes are generally used as a lubricant and generally comprise higher fatty acid compounds. As the examples of the synthetic waxes, the following can be exemplified.

1) Fatty Acid-Based Wax

A straight chain saturated fatty acid represented by the following formula:

$$CH_3(CH_2)_nCOOH$$

In the formula, n represents an integer of from 6 to 28. As the specific examples, stearic acid, behenic acid, palmitic acid, 12-hydroxystearic acid, and azelaic acid can be exemplified.

In addition, the metal salts of the above fatty acids (e.g., with K, Ca, Zn and Mg) can be exemplified.

2) Fatty Acid Ester-Based Wax

As the examples of the fatty acid esters, ethyl stearate, lauryl stearate, ethyl behenate, hexyl behenate and behenyl myristate can be exemplified.

3) Fatty Acid Amide-Based Wax

As the examples of the fatty acid amides, stearic acid amide and lauric acid amide can be exemplified.

4) Aliphatic Alcohol-Based Wax

A straight chain saturated aliphatic alcohol represented by the following formula:

$$CH_3(CH_2)_nOH$$

In the formula, n represents an integer of from 6 to 28. As the specific examples, stearyl alcohol can be exemplified.

Of the above synthetic waxes 1) to 4), higher fatty acid amides such as stearic acid amide and lauric acid amide are preferred. Further, these wax compounds can be used alone or in arbitrary combination, as desired.

(2) Plasticizers

As the plasticizers, ester compounds are preferred, and well-known plasticizers can be exemplified, such as phthalic esters, e.g., dibutyl phthalate, di-n-octyl phthalate, di(2-ethylhexyl) phthalate, dinonyl phthalate, dilauryl phthalate, butyllauryl phthalate, and butylbenzyl phthalate, aliphatic dibasic esters, e.g., di(2-ethylhexyl) adipate, and di(2-ethylhexyl) sebacate, phosphoric triesters, e.g., tricresyl phosphate and tri(2-ethylhexyl) phosphate, polyol polyesters, e.g., polyethylene glycol ester, and epoxy compounds, e.g., epoxy fatty acid ester. Of these compounds, esters of vinyl monomers, in particular, acrylic esters and methacrylic esters are preferred in view of the improvement of transfer sensitivity, the improvement of transfer unevenness, and the big controlling effect of breaking elongation.

As the acrylic or methacrylic ester compounds, polyethylene glycol dimethacrylate, 1,2,4-butanetriol trimethacrylate, trimethylolethane triacrylate, pentaerythritol acrylate, pentaerythritol tetraacrylate, dipentaerythritol polyacrylate can be exemplified.

The above plasticizers may be high polymers, and polyesters are preferred above all, since the addition effect is large and they hardly diffuse under storage conditions. As the polyesters, e.g., sebacic acid polyester and adipic acid polyester are exemplified.

The additives contained in the image-forming layer are not limited these compounds. The plasticizers may be used alone or in combination of two or more.

When the content of these additives in the image-forming layer are too much, in some cases, the resolution of the transferred image is deteriorated, the film strength of the image-forming layer itself is reduced, or sometimes the unexposed area is transferred to the image-receiving sheet due to the reduction of the adhesion of the light-to-heat converting layer and the image-forming layer. From the above viewpoint, the content of the waxes is preferably from 0.1 to 30 mass % of the entire solid content in the image-forming layer, and more preferably from 1 to 20 mass %. The content of the plasticizers is preferably from 0.1 to 20 mass % of the entire solid content in the image-forming layer, and more preferably from 0.1 to 10 mass %.

(3) Others

In addition to the above components, the image-forming layer may further contain a surfactant, inorganic or organic fine particles (e.g., metallic powder and silica gel), oils (e.g., linseed oil and mineral oil), a thickener and an antistatic agent. Except for the case of obtaining a black image, energy necessary for transfer can be reduced by using a material which absorbs the wavelengths of light sources for use in image recording. As the materials which absorb the wavelengths of light sources, either pigments or dyes may be used, but in the case of obtaining a color image, it is preferred in view of color reproduction to use infrared light sources such as a semiconductor laser in image recording and to use dyes having small absorption in the visible region and great absorption in the wavelengths of light sources. As the examples of infrared absorbing dyes, the compounds disclosed in JP-A-3-103476 can be exemplified.

The image-forming layer can be provided by dissolving or dispersing the pigment and the binder, to thereby prepare a coating solution, coating the coating solution on the light-to-heat converting layer (when an intermediate layer such as the following heat-sensitive peeling layer is provided on the light-to-heat converting layer, the coating solution is coated on the heat-sensitive peeling layer) and drying. As the solvent for use in the preparation of the coating solution, n-propyl alcohol, methyl ethyl ketone, propylene glycol monomethyl ether (MFG), methanol and water can be exemplified. Coating and drying can be performed according to ordinary coating and drying methods.

If necessary, an intermediate layer may be provided between the light-to-heat converting layer and the image-forming layer. As the intermediate layer, a heat-sensitive peeling layer containing a heat-sensitive material which generates gas by the action of the heat generated in the light-to-heat converting layer or releases adhesive moisture to thereby lower the adhesion strength between the light-to-heat converting layer and the image-forming layer can be provided on the light-to-heat converting layer in the thermal transfer sheet. As such heat-sensitive materials, compounds (polymers or low molecular compounds) which themselves are decomposed by heat, or properties of which are changed by heat, and generate gas, and compounds (polymers or low molecular compounds) which are absorbing, or are being adsorbed with, a considerable amount of easily-gasifying gases, such as moisture, can be used. These compounds may be used in combination.

As the examples of the polymers which themselves are decomposed by heat, or properties of which are changed by heat, and generate gas, self oxidizing polymers, e.g., nitrocellulose, halogen-containing polymers, e.g., chlorinated polyolefin, chlorinated rubber, poly-rubber chloride, polyvinyl chloride, and polyvinylidene chloride, acryl-based polymers, e.g., polyisobutylmethacrylate which is being adsorbed with gasifying compound such as moisture, cellulose esters, e.g., ethyl cellulose which is being adsorbed with gasifying compound such as moisture, and natural high molecular compounds, e.g., gelatin which is being adsorbed with gasifying compound such as moisture can be exemplified. As the examples of low molecular compounds which are decomposed by heat or properties of which are changed by heat and generate gas, diazo compounds and azide compounds which generate heat, decomposed and generate gas can be exemplified.

Decomposition and property change by heat of the heat-sensitive material as described above preferably occur at 280° C. or less, and particularly preferably 230° C. or less.

When low molecular compounds are used as the heat-sensitive material of the heat-sensitive peeling layer, it is preferred to combine the material with a binder. As the binder, the polymers which themselves are decomposed by heat, or properties of which are changed by heat, and generate gas can be used, but ordinary binders which do not have such property can also be used. When the heat-sensitive low molecular compound is used in combination with a binder, the mass ratio of the former to the latter is preferably from 0.02/1 to 3/1, and more preferably from 0.05/1 to 2/1. It is preferred that the heat-sensitive peeling layer cover the light-to-heat converting layer almost entirely and the thickness of the heat-sensitive peeling layer is generally from 0.03 to 1 μm, and preferably from 0.05 to 0.5 μm.

When the constitution of the thermal transfer sheet comprises a support having provided thereon a light-to-heat converting layer, a heat-sensitive peeling layer and an image-forming layer in this order, the heat-sensitive peeling layer is decomposed by heat conducted from the light-to-heat converting layer, or properties of which are changed by heat, and generates gas. The heat-sensitive peeling layer is partially lost or cohesive failure is caused in the heat-sensitive peeling layer due to the decomposition or gas generation, as a result the adhesion strength between the light-to-heat converting layer and the image-forming layer is lowered and, according to the behavior of the heat-sensitive peeling layer, a part of the heat-sensitive peeling layer migrates to the surface of the image finally formed with the image-forming layer and causes color mixture of the image. Therefore, it is preferred that the heat-sensitive peeling layer is scarcely colored, i.e., the heat-sensitive peeling layer shows high transmittance to visible rays, so that color mixture does not appear visually on the image formed, even if such transfer of the heat-sensitive peeling layer occurs. Specifically, the absorptivity of the heat-sensitive peeling layer to visible rays is 50% or less, and preferably 10% or less.

Further, instead of providing an independent heat-sensitive peeling layer, the thermal transfer sheet may take the constitution such that the light-to-heat converting layer is formed by adding the heat-sensitive material to the coating solution of the light-to-heat converting layer, and the light-to-heat converting layer doubles as the heat-sensitive peeling layer.

It is preferred that the coefficient of static friction of the outermost layer of the thermal transfer sheet of the side on which the image-forming layer is provided is 0.35 or less, and preferably 0.20 or less. When the coefficient of static friction of the outermost layer is 0.35 or less, the contamination of the roll for carrying the thermal transfer sheet can be suppressed and the quality of the image formed can be improved. The measurement of coefficient of static friction is according to the method disclosed in paragraph [0011] of Japanese Patent Application No. 2000-85759.

It is preferred that the image-forming layer surface has Smooster value at 23° C., 55% RH of from 0.5 to 50 mmHg (=about 0.0665 to 6.65 kPa), and Ra of from 0.05 to 0.4 μm, which can reduce a great number of micro voids by which the image-receiving layer and the image-forming layer cannot be brought into contact with each other at the contact area, thus preferred in the point of transfer and image quality. The Ra value can be measured by a surface roughness meter (Surf com, manufactured by Tokyo Seiki Co., Ltd.) according to JIS B0601. It is preferred that the surface hardness of the image-forming layer is 10 g or more when measured with a sapphire needle. When the thermal transfer sheet is electrically charged according to U.S. test standard 4046 and then grounded, the electrification potential of the image-forming layer 1 second after grounding of the thermal transfer sheet is preferably from −100 to 100 V. It is preferred that the surface resistance of the image-forming layer at 23° C., 55% RH is $10^9$Ω or less.

In the next place, the image-receiving sheet which can be used in combination with the thermal transfer sheet is described below.

Image-Receiving Sheet

Layer Constitution

The constitution of the image-receiving sheet generally comprises a support having provided thereon one or more image-receiving layer(s) and, if necessary, any one or two or more layer(s) of a cushioning layer, a peeling layer and an intermediate layer is (are) provided between the support and the image-receiving layer. It is preferred in view of conveyance to provide a backing layer on the surface of the support opposite to the side on which the image-receiving layer is provided.

Support

A plastic sheet, a metal sheet, a glass sheet, a resin-coated paper, a paper, and ordinary sheet-like substrate materials, e.g., various complexes, are used as the support. As the examples of plastic sheets, a polyethylene terephthalate sheet, a polycarbonate sheet, a polyethylene sheet, a polyvinyl chloride sheet, a polyvinylidene chloride sheet, a polystyrene sheet, a styrene-acrylonitrile sheet, and a polyester sheet can be exemplified. As the examples of papers, an actual printing paper and a coated paper can be used.

It is preferred for the support to have minute voids in view of capable of improving the image quality. Such supports can be produced by mixing a thermoplastic resin and a filler comprising an inorganic pigment and a high polymer incompatible with the above thermoplastic resin to thereby prepare a mixed melt, extruding the mixed melt by a melt extruder to prepare a monolayer or multilayer film, and further monoaxially or biaxially stretching the film. In this step, the void ratio is determined by the selection of the resin and the filler, a mixing ratio and stretching condition.

As the thermoplastic resins, a polyolefin resin, such as polypropylene, and a polyethylene terephthalate resin are preferred, since they are excellent in crystallizability and orientation property and voids can be formed easily. It is preferred to use the polyolefin resin or the polyethylene terephthalate resin as the main component and use a small amount of other thermoplastic resin arbitrarily in combination. The inorganic pigments for use as the filler preferably have an average particle size of from 1 to 20 μm, e.g., calcium carbonate, clay, diatomaceous earth, titanium oxide, aluminum hydroxide and silica can be used. As the incompatible resins for use as the filler, when polypropylene is used as the thermoplastic resin, it is preferred to combine polyethylene terephthalate as the filler. A support having minute voids is disclosed in detail in JP-A-2001-105752.

The content of the filler, e.g., an inorganic pigment, in the support is generally from 2 to 30% by volume or so.

The thickness of the support in the image-receiving sheet is generally from 10 to 400 μm, and preferably from 25 to 200 μm. For enhancing the adhesion with the image-receiving layer (or the cushioning layer) or with the image-forming layer in the thermal transfer sheet, the surface of the support in the image-receiving sheet may be subjected to surface treatment, e.g., corona discharge treatment and glow discharge treatment.

Image-Receiving Layer

It is preferred to provide one or more image-receiving layer(s) on the support in the image-receiving sheet for transferring and fixing the image-forming layer on the image-receiving sheet. The image-receiving layer is preferably a layer formed with an organic polymer binder as the main component. The binders are preferably thermoplastic resins, such as homopolymers and copolymers of acryl-based monomers, e.g., acrylic acid, methacrylic acid, acrylic ester, and methacrylic ester, cellulose-based polymers, e.g., methyl cellulose, ethyl cellulose and cellulose acetate, homomonomers and copolymers of vinyl-based monomers, e.g., polystyrene, polyvinyl pyrrolidone, polyvinyl butyral, polyvinyl alcohol and polyvinyl chloride, condensed polymers, e.g., polyester and polyamide, and rubber-based polymers, e.g., butadiene-styrene copolymer. The binder for use in the image-receiving layer is preferably a polymer having a glass transition temperature (Tg) of 90° C. or lower for obtaining appropriate adhesion with the image-forming layer. For that purpose, it is possible to added a plasticizer to the image-receiving layer. The binder polymer preferably has Tg of 30° C. or more for preventing blocking between sheets. As the binder polymer of the image-receiving layer, the same or analogous monomer unit as the monomer unit constituting the binder polymer of the image-forming layer is preferably used from the point of improving the adhesion with the image-forming layer at laser recording and improving sensitivity and image strength.

It is preferred that the image-receiving layer surface has Smooster value at 23° C., 55% RH of from 0.5 to 50 mmHg (=about 0.0665 to 6.65 kPa), and Ra of from 0.05 to 0.4 μm, which can reduce a great number of micro voids by which the image-receiving layer and the image-forming layer cannot be brought into contact with each other at the contact area, thus preferred in the point of transfer and image quality. The Ra value can be measured by a surface roughness meter (Surfcom, manufactured by Tokyo Seiki Co., Ltd.) according to JIS B0601. When the image-receiving sheet is electrically charged according to U.S. test standard 4046 and then grounded, the electrification potential of the image-receiving layer 1 second after grounding of the image-receiving sheet is preferably from −100 to 100 V. It is preferred that the surface resistance of the image-receiving layer at 23° C., 55% RH is $10^9\Omega$ or less. It is preferred that the static friction coefficient of the surface of the image-receiving layer is 0.2 or less. It is preferred that the surface energy of the surface of the image-receiving layer is from 23 to 35 $mg/m^2$.

When the image once formed on the image-receiving layer is re-transferred to the actual printing paper, it is also preferred that at least one image-receiving layer is formed of a photo-setting material. As the composition of such a photo-setting material, combination comprising a) a photopolymerizable monomer comprising at least one kind of a polyfunctional vinyl or vinylidene compound which can form a photopolymer by addition polymerization, b) an organic polymer, and c) a photopolymerization initiator, and, if necessary, additives, e.g., a thermal polymerization inhibitor can be exemplified. As the above polyfunctional vinyl monomer, unsaturated ester of polyol, in particular, an acrylic or methacrylic ester (ethylene glycol diacrylate, pentaerythritol tetraacrylate) is used.

As the organic polymer, the polymers for use for forming the image-receiving layer can be exemplified. As the photopolymerization initiator, an ordinary photo-radical polymerization initiator, e.g., benzophenone and Michler's ketone, can be used in proportion of from 0.1 to 20 mass % in the layer.

The thickness of the image-receiving layer is generally from 0.3 to 7 μm, and preferably from 0.7 to 4 μm. When the thickness of the image-receiving layer is less than 0.3 μm, the film strength is insufficient at re-transferring to the actual printing paper and the film breaks easily. While when the thickness of the image-receiving layer is too thick, the glossiness of the image after re-transferring to the actual paper increases, and the approximation to the printed matter is reduced.

Other Layers

A cushioning layer may be provided between the support and the image-receiving layer. When a cushioning layer is provided, it is possible to increase the adhesion of the image-forming layer and the image-receiving layer at thermal transfer by laser and the image quality can be improved. Further, even if foreign matters enter between the thermal transfer sheet and the image-receiving sheet during recording, the voids between the image-receiving layer and the image-forming layer are reduced by the deforming action of the cushioning layer, as a result the size of image defect such as blank area can be made small. Further, when the image formed by transfer is re-transferred to the actual printing paper, since the surface of the image-receiving layer is deformed according to the surface unevenness of the paper, the transferring property of the image-receiving layer can be improved. Further, by reducing the glossiness of the transferred image, the approximation to the printed matter can be improved.

The cushioning layer is formed to be liable to be deformed when stress is laid on the image-receiving layer, hence for obtaining the above effect, the cushioning layer preferably comprises materials having a low modulus of elasticity, materials having elasticity of a rubber, or thermoplastic resins easily softened by heat. The modulus of elasticity of the cushioning layer at room temperature is preferably from 0.5 MPa to 1.0 GPa, more preferably from 1 MPa to 0.5 GPa, and particularly preferably from 10 to 100 MPa. For burying foreign matters such as dust, the penetration according to JIS K2530 (25° C., 100 g, 5 seconds) is preferably 10 or more. The cushioning layer has a glass transition temperature of 80° C. or less, preferably 25° C. or less, and a softening point of preferably from 50 to 200° C. It is also preferred to add a plasticizer to the binder for controlling these physical properties, e.g., Tg.

As the specific materials for use as the binder of the cushioning layer, besides rubbers, e.g., urethane rubber, butadiene rubber, nitrile rubber, acryl rubber and natural rubber, polyethylene, polypropylene, polyester, styrene-butadiene copolymer, ethylene-vinyl acetate copolymer, ethylene-acryl copolymer, vinyl chloride-vinyl acetate copolymer, vinylidene chloride resin, vinyl chloride resin containing a plasticizer, polyamide resin and phenol resin can be exemplified.

The thickness of the cushioning layer varies according to the resins used and other conditions, but is generally from 3 to 100 μm, and preferably from 10 to 52 μm.

It is necessary that the image-receiving layer and the cushioning layer are adhered to each other until the stage of laser recording, but it is preferred that they are designed to be releasable for transferring an image to the actual printing paper. For easy release, it is also preferred to provide a peeling layer having a thickness of from 0.1 to 2 μm or so between the cushioning layer and the image-receiving layer. When the thickness of the peeling layer is too thick, the properties of the cushioning layer are difficult to be exhibited, thus it is necessary to adjust the thickness by the kind of the peeling layer.

The specific examples of the binders of the peeling layer include thermo-setting resins having Tg of 65° C. or more, e.g., polyolefin, polyester, polyvinyl acetal, polyvinyl formal, polyparabanic acid, methyl polymethacrylate, polycarbonate, ethyl cellulose, nitrocellulose, methyl cellulose, carboxymethyl cellulose, hydroxypropyl cellulose, polyvinyl alcohol, polyvinyl chloride, urethane resin, fluorine resin, styrenes, e.g., polystyrene and acrylonitrile styrene, crosslinked products of these resins, polyamide, polyimide, polyether imide, polysulfone, polyether sulfone, aramid, and hardened products of these resins. As the hardening agent, generally used hardening agents, e.g., isocyanate and melamine, can be used.

When the binders of the peeling layer are selected by taking the above physical properties into consideration, polycarbonate, acetal and ethyl cellulose are preferred in view of the storage stability, and further, when acrylate resins are added to the image-receiving layer, releasability at re-transferring of the image after laser thermal transfer becomes good and preferred.

Further, a layer whose adhesion with the image-receiving layer extremely lowers by cooling can be used as the peeling layer. Specifically, layers containing heat fusion compounds such as waxes and binder, and thermoplastic resins as the main component can be used as such a layer.

The examples of the heat fusion compounds are disclosed in JP-A-63-193886. In particular, micro crystalline wax, paraffin wax, and carnauba wax are preferably used. As the thermoplastic resins, ethylene-based copolymers, e.g., ethylene-vinyl acetate resins and cellulose-based resins are preferably used.

As the additives, higher fatty acid, higher alcohol, higher fatty acid ester, amides, and higher amine can be added to the peeling layer, according to necessity.

As another constitution of the peeling layer, there is a layer which has releasability by causing cohesive failure due to fusion or softening by heating. It is preferred to add a supercooling substance to such a peeling layer.

As the supercooling substance, poly-ε-caprolactone, polyoxyethylene, benzotriazole, tribenzylamine and vanillin can be exemplified.

Still another constitution of the peeling layer, a compound to reduce the adhesion with the image-receiving layer is added to the peeling layer. As such compounds, silicone-based resins, e.g., silicone oil; Teflon, fluorine-based resins, e.g., fluorine-containing acrylate resin; polysiloxane resins; acetal-based resins, e.g., polyvinyl butyral, polyvinyl acetal and polyvinyl formal; solid waxes, e.g., polyethylene wax and amide wax; and fluorine-based and phosphoric ester-based surfactants can be exemplified.

The peeling layer can be prepared by dissolving the above materials in a solvent or dispersing the above materials in a latex state, and coating the above solution or dispersion on the cushioning layer by a blade coater, a roll coater, a bar coater, a curtain coater, or gravure coater, or extrusion lamination by hot melt. As another method, the solution or dispersion obtained by dissolving the above materials in a solvent or dispersing the above materials in a latex state is coated on a temporary base by the above coating method, the temporary base is adhered with the cushioning layer, and then the temporary base is released.

In the image-receiving sheet to be combined with the thermal transfer sheet, the image-receiving layer may double as the cushioning layer, and in that case, the image-receiving sheet may take the constitution such as support/cushioning image-receiving layer, or support/undercoat layer/cushioning image-receiving layer. In this case, it is also preferred that cushioning image-receiving layer has releasability so that re-transferring to the actual printing paper is possible. In this case, the image after being re-transferred to the actual printing paper becomes a glossy image.

The thickness of the cushioning image-receiving layer is from 5 to 100 μm, and preferably from 10 to 40 μm.

It is preferred to provide a backing layer on the side of the support of the image-receiving sheet opposite to the side on which the image-receiving layer is provided for improving the traveling property of the image-receiving sheet. When a surfactant, an antistatic agent, e.g., fine particles of tin oxide, and a matting agent, e.g., silicon oxide and PMMA particles, are added to the backing layer, the traveling property in the recording unit is improved.

These additives can be added not only to the backing layer but also to the image-receiving layer and other layers, if desired. The kinds of the additives cannot be prescribed unconditionally according to purposes, but a matting agent having an average particle size of from 0.5 to 10 μm can be added in concentration of from 0.5 to 80% or so, and an antistatic agent can be added by selecting arbitrarily from among various surfactants and electrically conductive agents so that the surface resistance of the layer at 23° C., 50% RH becomes preferably $10^{12}\Omega$ or less, more preferably $10^{9}\Omega$ or less.

As the binder for use in the backing layer, widely used polymers can be used, e.g., gelatin, polyvinyl alcohol, methyl cellulose, nitrocellulose, acetyl cellulose, aromatic polyamide resin, silicone resin, epoxy resin, alkyd resin, phenol resin, melamine resin, fluorine resin, polyimide resin, urethane resin, acryl resin, urethane-modified silicone resin, polyethylene resin, polypropylene resin, polyester resin, Teflon resin, polyvinyl butyral resin, vinyl chloride-based resin, polyvinyl acetate, polycarbonate, organic boron compounds, aromatic esters, polyurethane fluoride, and polyether sulfone can be used.

When crosslinkable water-soluble binder is used as the binder of the backing layer for crosslinking, dropout prevention of a matting agent and scratch resistance of the backing layer are improved, further it is effective for blocking during storage.

The crosslinking means can be selected with no limitation from heat, actinic rays and pressure, according to the characteristics of the crosslinking agent to be used, and these may be used alone or in combination. For providing an adhering property to the support, an arbitrary adhesion layer may be provided on the same side of the support on which the backing layer is provided.

Organic or inorganic fine particles are preferably added to the backing layer as the matting agent. As the organic matting agent, polymethyl methacrylate (PMMA), polystyrene, polyethylene, polypropylene, fine particles of other radical polymers, and condensed polymers such as polyester and polycarbonate are exemplified.

The backing layer is preferably provided in an amount of about 0.5 to 5 $g/m^2$. When the amount is less than 0.5 $g/m^2$, coating property is unstable and a problem of dropout of the matting agent is liable to occur. While when the coating amount greatly exceeds 5 $g/m^2$, the preferred particle size of the matting agent becomes extremely large and embossing of the image-receiving layer surface by the backing layer is caused during storage, and in the thermal transfer of a thin image-forming layer, the dropout of the recorded image and unevenness are liable to occur.

The number average particle size of the matting agent is preferably larger than the layer thickness of the backing layer containing a binder alone by 2.5 to 20 μm. Of the matting agents, particles having a particle size of 8 μm or more are necessary to be present in an amount of 5 $mg/m^2$ or more, preferably from 6 to 600 $mg/m^2$, by which the defect due to foreign matters can be improved. Further, when a matting agent of narrow particle size distribution is used, i.e., when a matting agent having the value obtained by dividing the standard deviation of the particle size distribution by the number average particle size, σ/rn (the variation coefficient of particle size distribution) of 0.3 or less is used, the defect which occurs when particles having an extraordinary big particle size are used can be improved, and further, the desired performance can be obtained with the less addition amount. The variation coefficient is more preferably 0.15 or less.

It is preferred to add an antistatic agent to the backing layer for the purpose of preventing adhesion of foreign matters due to the frictional electrification with a carrier roller. As the antistatic agent, a cationic surfactant, an anionic surfactant, a nonionic surfactant, a high molecular antistatic agent, electrically conductive fine particles, in addition, the compounds described in 11290 *no Kagaku Shohin* (11290 *Chemical Commercial Products*), pp. 875 and 876, Kagaku Kogyo Nippo-Sha can be widely used.

As antistatic agents which can be used in the backing layer in combination, of the above compounds, metallic oxide, e.g., carbon black, zinc oxide, titanium oxide and tin oxide, and electrically conductive fine particles, e.g., organic semiconductors, are preferably used. In particular, when electrically conductive fine particles are used, the dissociation of the antistatic agent from the backing layer can be prevented, and stable antistatic effect can be preferably obtained irrespective of the surroundings.

It is also possible to add a mold-releasing agent, e.g., various activators, silicone oil, and fluorine resins, to the backing layer for providing a coating property and a mold-releasing property.

When the softening point of the cushioning layer and the image-receiving layer measured by TMA (Thermomechanical Analysis) is 70° C. or lower, the backing layer is particularly preferred.

TMA softening point is obtained by observing the phase of the object with increasing the temperature of the object of observation at constant rate and applying a constant load to the object. In the present invention, the temperature at the time when the phase of the object begins to change is defined as TMA softening point. The softening point by TMA can be measured with an apparatus such as Thermoflex (manufactured by Rigaku Denki-Sha Co.).

The thermal transfer sheet and the image-receiving sheet can be used in image forming as the laminate by superposing the image-forming layer in the thermal transfer sheet and the image-receiving layer in the image-receiving sheet.

The laminate of the thermal transfer sheet and the image-receiving sheet can be produced by various methods. For example, the laminate can be easily obtained by superposing the image-forming layer in the thermal transfer sheet and the image-receiving layer in the image-receiving sheet and passing through a pressure and heating roller. The heating temperature in this case is 160° C. or less, and preferably 130° C. or less.

The above-described vacuum adhesion method can also be preferably used for obtaining the laminate. The vacuum adhesion method is a method of winding the image-receiving sheet around the drum provided with suction holes for vacuum sucking, and then vacuum-adhering the thermal transfer sheet of a little larger size than the image-receiving sheet on the image-receiving sheet with uniformly blasting air by a squeeze roller. As other method, a method of mechanically sticking the image-receiving sheet on a metal drum with pulling the image-receiving sheet, and further mechanically sticking the thermal transfer sheet thereon with pulling in the same manner can also be used. Of these methods, the vacuum adhesion method is especially preferred in the point of requiring no temperature control and capable of effecting lamination rapidly and uniformly.

EXAMPLES

The present invention will be described below with reference to the examples but the present invention is not limited to these examples at all. In the examples, "parts" means "parts by mass" unless otherwise indicated.

Example 1

Preparation of Thermal Transfer Sheet K (Black)

Formation of Backing Layer

Preparation of First Backing Layer Coating Solution

| | |
|---|---|
| Water dispersion solution of acrylate resin (Julymer ET410, solid content: 20 mass %, manufactured by Nippon Junyaku Co., Ltd.) | 2 parts |

-continued

| | |
|---|---|
| Antistatic agent (water dispersion of tin oxide-antimony oxide, average particle size: 0.1 μm, 17 mass %) | 7.0 parts |
| Polyoxyethylenephenyl ether | 0.1 part |
| Melamine compound (Sumitic Resin M-3, manufactured by Sumitomo Chemical Industry Co., Ltd.) | 0.3 parts |
| Distilled water to make the total amount | 100 parts |

Formation of First Backing Layer

One surface (back surface) of a biaxially stretched polyethylene terephthalate support (Ra of both surfaces was 0.01 μm) having a thickness of 75 μm was subjected to corona discharge treatment. The first backing layer coating solution was coated on the support in a dry coating thickness of 0.03 μm, and the coated layer was dried at 180° C. for 30 seconds, thereby the first backing layer was prepared. The Young's modulus of the support in the machine direction was 450 $kg/mm^2$ (=about 4.4 GPa), and the Young's modulus of the support in the transverse direction was 500 $kg/mm^2$ (=about 4.9 GPa). The F-5 value of the support in the machine direction was 10 $kg/mm^2$ (=about 98 MPa), and the F-5 value of the support in the transverse direction was 13 $kg/mm^2$ (=about 127.4 MPa), the heat shrinkage at 100° C. for 30 minutes of the support in the machine direction was 0.3%, and that in the transverse direction was 0.1%. The breaking strength in the machine direction was 20 $kg/mm^2$ (=about 196 MPa), and that in the transverse direction was 25 $kg/mm^2$ (=about 245 MPa), and the modulus of elasticity was 400 $kg/mm^2$ (=about 3.9 GPa).

Preparation of Second Backing Layer Coating Solution

| | |
|---|---|
| Polyolefin (Chemipearl S-120, 27 mass %, manufactured by Mitsui Petrochemical Industries, Ltd.) | 3.0 parts |
| Antistatic agent (water dispersion of tin oxide-antimony oxide, average particle Size: 0.1 μm, 17 mass %) | 2.0 parts |
| Colloidal silica (Snowtex C, 20 mass %, manufactured by Nissan Chemical Industries, Ltd.) | 2.0 parts |
| Epoxy compound (Dinacole EX-614B, manufactured by Nagase Kasei Co., Ltd.) | 0.3 parts |
| Distilled water to make the total amount | 100 parts |

Formation of Second Backing Layer

The second backing layer coating solution was coated on the first backing layer in a dry coating thickness of 0.03 μm, and the coated layer was dried at 170° C. for 30 seconds, thereby the second backing layer was prepared.

1) Preparation of Light-to-Heat Converting Layer Coating Solution

The following components were mixed with stirring by a stirrer and the light-to-heat converting layer coating solution was prepared.

Composition of Light-to-Heat Converting Layer Coating Solution

| | |
|---|---|
| Infrared absorbing dye (NK-2014, manufactured by Hayashibara Seibutsu Kagaku Kenkyusho Co., a cyanine dye having the following composition) | 10 parts |
| 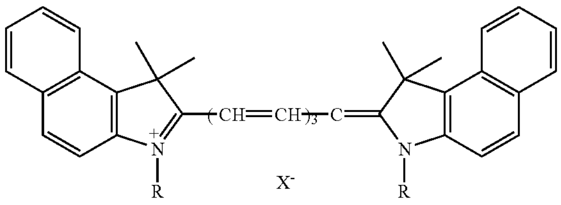 | |
| In the formula, R represents $CH_3$ and $X^-$ represents $ClO_4^-$. | |
| Polyimide resin represented by the following formula (Rika Coat SN-20F, manufactured by Shin Nihon Rika KK., heat decomposition temperature: 510° C.) | 4 parts |
| 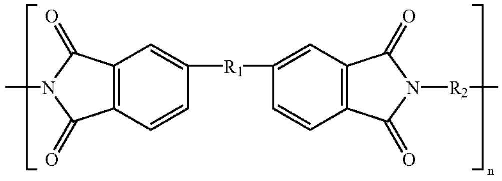 | |
| In the formula, $R_1$ represents $SO_2$ and $R_2$ represents the following formula: | |
| 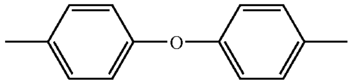 or | |

-continued

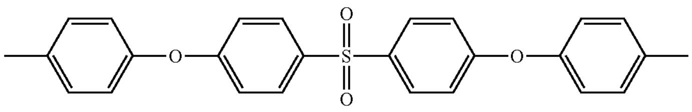

| | |
|---|---|
| N-Methyl-2-pyrrolidone (boiling point: 202° C., manufactured by Mitsubishi Chemicals Co., Ltd.) | 1,900 parts |
| Methyl ethyl ketone | 300 parts |
| Matting agent dispersion solution (Sea Hoster-KEP150, manufactured by Nippon Shokubai Co., Ltd.) | 2 parts |
| Surfactant (Megafac F-176P, manufactured by Dainippon Chemicals and Ink Co., Ltd.) | 1 part |

2) Formation of Light-to-Heat Converting Layer on Support Surface

The above-prepared light-to-heat converting layer coating solution was coated with a wire bar coater on one surface of a polyethyleneterephthalate film (support) having a thickness of 75 μm, and the coated product was dried in an oven at 120° C. for 2 minutes, thereby a light-to-heat converting layer was formed on the support. The optical density $OD_{LH}$ of the obtained light-to-heat converting layer at wavelength of 808 nm measured by UV-spectrophotometer UV-240 (manufactured by Shimadzu Seisakusho Co. Ltd.) was 1.03, and the layer thickness obtained by measuring the cross-section of the light-to-heat converting layer with a scanning electron microscope was 0.3 μm on average.

3) Preparation of Black Image-Forming Layer Coating Solution

Each of the following components was put in a kneading mill, and pre-treatment was performed with adding a small amount of a solvent and applying a shear force. The solvent was further added to the dispersion so as to obtain the following composition, and dispersion was performed for two hours in a sand mill, thereby the mother solution of a pigment dispersion was obtained.

Composition of Black Pigment Dispersion Mother Solution

| Composition 1 | |
|---|---|
| Polyvinyl butyral (Eslec B BL-SH, manufactured by Sekisui Chemical Industries, Ltd.) | 12.6 parts |
| Pigment Black 7 (carbon black, C.I. No. 77266, Mitsubishi Carbon Black #5, manufactured by Mitsubishi Chemicals Co. Ltd., PVC blackness: 1) | 4.5 parts |
| Dispersion assistant (Solspers S-20000, manufactured by ICI Co.) | 0.8 parts |
| n-Propyl alcohol | 79.4 parts |

| Composition 2 | |
|---|---|
| Polyvinyl butyral (Eslec B BL-SH, manufactured by Sekisui Chemical Industries, Ltd.) | 12.6 parts |

-continued

| Composition 2 | |
|---|---|
| Pigment Black 7 (carbon black, C.I. No. 77266, Mitsubishi Carbon Black MA100, manufactured by Mitsubishi Chemicals Co., Ltd., PVC blackness: 10) | 10.5 parts |
| Dispersion assistant (Solspers S-20000, manufactured by ICI Co.) | 0.8 parts |
| n-Propyl alcohol | 79.4 parts |

The following components were mixed by stirring with a stirrer to prepare a black image-forming layer coating solution.

Composition of Black Image-Forming Layer Coating Solution

| | |
|---|---|
| Above black pigment dispersion mother solution (composition 1/composition 2: 70/30 (parts)) | 185.7 parts |
| Polyvinyl butyral (Eslec B BL-SH, manufactured by Sekisui Chemical Industries, Ltd.) | 11.9 parts |
| Wax-based compound | |
| Stearic acid amide (Newtron 2, manufactured by Nippon Seika Co., Ltd.) | 1.7 parts |
| Behenic acid amide (Diamid EM, (manufactured by Nippon Kasei Co., Ltd.) | 1.7 parts |
| Lauric acid amide (Diamid Y, (manufactured by Nippon Kasei Co., Ltd.) | 1.7 parts |
| Palmitic acid amide (Diamid KP, (manufactured by Nippon Kasei Co., Ltd.) | 1.7 parts |
| Erucic acid amide (Diamid L-200, (manufactured by Nippon Kasei Co., Ltd.) | 1.7 parts |
| Oleic acid amide (Diamid O-200, (manufactured by Nippon Kasei Co., Ltd.) | 1.7 parts |
| Rosin (KE-311, manufactured by Arakawa Kagaku Co., Ltd., components: resin acid 80 to 97%, resin acid components: | 11.4 parts |
| abietic acid: 30 to 40% neoabietic acid: 10 to 20% dihydroabietic acid: 14% tetrahydroabietic acid: 14%) | |

-continued

| | |
|---|---|
| Surfactant (Megafac F-176PF, solid content: 20%, manufactured by Dainippon Chemicals and Ink Co., Ltd.) | 2.1 parts |
| Inorganic pigment (MEK-ST, 30% methyl ethyl ketone solution, manufactured by Nissan Chemical Industries, Ltd.) | 7.1 parts |
| n-Propyl alcohol | 1,050 parts |
| Methyl ethyl ketone | 295 parts |

It was found that the particles in the thus-obtained black image-forming layer coating solution had an average particle size of 0.25 μm, and the ratio of the particles having a particle size of 1 μm or more was 0.5% from the measurement by particle size distribution measuring apparatus of laser scattering system.

4) Formation of Black Image-Forming Layer on Light-to-Heat Converting Layer Surface The above black image-forming layer coating solution was coated on the surface of the light-to-heat converting layer with a wire bar coater for 1 minute, and the coated product was dried in an oven at 100° C. for 2 minutes, thus a black image-forming layer was formed on the light-to-heat converting layer. By the above procedure, a thermal transfer sheet comprising the support having provided thereon the light-to-heat converting layer and the black image-forming layer in this order from the support was prepared (hereinafter referred to as thermal transfer sheet K, similarly, a thermal transfer sheet provided with a yellow image-forming layer is referred to as thermal transfer sheet Y, a thermal transfer sheet provided with a magenta image-forming layer is referred to as thermal transfer sheet M, and a thermal transfer sheet provided with a cyan image-forming layer is referred to as thermal transfer sheet C).

The optical density (transmitted optical density) of the transmitted light of the black image-forming layer in the thus-obtained thermal transfer sheet K was 0.91 measured by Macbeth densitometer TD-904 (W filter), and the layer thickness of the black image-forming layer was 0.60 μm on average.

The obtained image-forming layer had the following physical properties.

The surface hardness of the image-forming layer is preferably 10 g or more when measured with a sapphire needle, and it was specifically 200 g or more.

The Smooster value of the surface at 23° C., 55% RH is preferably from 0.5 to 50 mmHg (=about 0.0665 to 6.65 kPa), and it was specifically 9.3 mmHg (=about 1.24 kPa).

The coefficient of static friction of the surface is preferably 0.2 or less, and it was specifically 0.08.

The surface energy was 29 mJ/m$^2$, and the contact angle with water was 94.8°.

The optical density (OD) was 1.82, the layer thickness was 0.60 μm, and the OD/layer thickness was 3.03.

The deformation rate of the light-to-heat converting layer was 168% when recording was performed at linear velocity of 1 m/sec or more with laser beams having light intensity at exposure surface of 1,000 W/mm$^2$ or more.

Preparation of Thermal Transfer Sheet Y

Thermal transfer sheet Y was prepared in the same manner as in the preparation of thermal transfer sheet K, except that the yellow image-forming layer coating solution having the composition shown below was used in place of the black image-forming layer coating solution. The layer thickness of the image-forming layer in the obtained thermal transfer sheet Y was 0.42 μm.

Composition of Yellow Pigment Dispersion Mother Solution

| Yellow pigment composition 1 | |
|---|---|
| Polyvinyl butyral (Eslec B BL-SH, manufactured by Sekisui Chemical Industries, Ltd.) | 7.1 parts |
| Pigment Yellow (pigment yellow 180, C.I. No. 21290) (Novoperm Yellow P-HG, manufactured by Clariant Japan, K.K.) | 12.9 parts |
| Dispersion assistant (Solspers S-20000, manufactured by ICI Co.) | 0.6 parts |
| n-Propyl alcohol | 79.4 parts |

Composition of Yellow Pigment Dispersion Mother Solution

| Yellow pigment composition 2 | |
|---|---|
| Polyvinyl butyral (Eslec B BL-SH, manufactured by Sekisui Chemical Industries, Ltd.) | 7.1 parts |
| Pigment Yellow 139 (carbon black, C.I. No. 56298) (Novoperm Yellow M2R 70, manufactured by Clariant Japan, K.K.) | 12.9 parts |
| Dispersion assistant (Solspers S-20000, manufactured by ICI Co.) | 0.6 parts |
| n-Propyl alcohol | 79.4 parts |

Composition of Yellow Image-Forming Layer Coating Solution

| | |
|---|---|
| Above yellow pigment dispersion mother solution (yellow pigment composition 1/ yellow pigment composition 2: 95/5 (parts)) | 126 parts |
| Polyvinyl butyral (Eslec B BL-SH, manufactured by Sekisui Chemical Industries, Ltd.) | 4.6 parts |
| Wax-based compound | |
| Stearic acid amide (Newtron 2, manufactured by Nippon Seika Co., Ltd.) | 0.7 parts |
| Behenic acid amid. (Diamid BM, (manufactured by Nippon Kasei Co., Ltd.) | 0.7 parts |
| Lauric acid amide (Diamid Y, (manufactured by Nippon Kasei Co., Ltd.) | 0.7 parts |
| Palmitic acid amide (Diamid KP, (manufactured by Nippon Kasei Co., Ltd.) | 0.7 parts |
| Erucic acid amide (Diamid L-200, (manufactured by Nippon Kasei Co., Ltd.) | 0.7 parts |
| Oleic acid amide (Diamid O-200, (manufactured by Nippon Kassi Co., Ltd.) | 0.7 parts |
| Nonionic surfactant (Chemistat 1100, manufactured by Sanyo Chemical Industries, Co., Ltd.) | 0.4 parts |
| Rosin (KE-311, manufactured by Arakawa Kagaku Co., Ltd., components: resin acid 80 to 97%, | 2.4 parts |

-continued

| resin acid components: | |
|---|---|
| abietic acid: 30 to 40% | |
| neoabietic acid: 10 to 20% | |
| dihydroabietic acid: 14% | |
| tetrahydroabietic acid: 14%) | |
| Surfactant (Megafac F-176PF, solid content: 20%, manufactured by Dainippon Chemicals and Ink Co., Ltd.) | 0.8 parts |
| n-Propyl alcohol | 793 parts |
| Methyl ethyl ketone | 198 parts |

The obtained image-forming layer had the following physical properties.

The surface hardness of the image-forming layer is preferably 10 g or more when measured with a sapphire needle, and it was specifically 200 g or more.

The Smooster value of the surface at 23° C., 55% RH is preferably from 0.5 to 50 mmHg (=about 0.0665 to 6.65 kPa), and it was specifically 2.3 mmHg (=about 0.31 kPa).

The coefficient of static friction of the surface is preferably 0.2 or less, and it was specifically 0.1.

The surface energy was 24 $mJ/m^2$, and the contact angle with water was 108.1°.

The optical density (OD) was 1.01, the layer thickness was 0.42 μm, and the OD/layer thickness was 2.40.

The deformation rate of the light-to-heat converting layer was 150% when recording was performed at linear velocity of 1 m/sec or more with laser beams having light intensity at exposure surface of 1,000 $W/mm^2$ or more.

Preparation of Thermal Transfer Sheet M

Thermal transfer sheet M was prepared in the same manner as in the preparation of thermal transfer sheet K, except that the magenta image-forming layer coating solution having the composition shown below was used in place of the black image-forming layer coating solution. The layer thickness of the image-forming layer in the obtained thermal transfer sheet M was 0.38 μm.

Composition of Magenta Pigment Dispersion Mother Solution

| Magenta pigment composition 1 | |
|---|---|
| Polyvinyl butyral (Denka Butyral #2000-L, manufactured by Denki Kagaku Kogyo Co., Ltd., Vicut softening point: 57° C.) | 12.6 parts |
| Pigment Red (pigment yellow 57:1, C.I. No. 15850:1) (Symuler Brilliant Carmine 6B-229, manufactured by Dainippon Chemicals and Ink Co., Ltd.) | 15.0 parts |
| Dispersion assistant (Solspers S-20000, manufactured by ICI Co.) | 0.6 parts |
| n-Propyl alcohol | 80.4 parts |

Composition of Magenta Pigment Dispersion Mother Solution

| Magenta pigment composition 2 | |
|---|---|
| Polyvinyl butyral (Denka Butyral #2000-L, manufactured by Denki Kagaku Kogyo Co., Ltd., Vicut softening point: 57° C.) | 12.6 parts |
| Pigment Red 57:1 C.I. No. 15850) (Lionol Red 6B-4290G, manufactured by Toyo Ink Mfg. Co., Ltd.) | 15.0 parts |
| Dispersion assistant (Solspers S-20000, manufactured by ICI Co.) | 0.6 parts |
| n-Propyl alcohol | 79.4 parts |

Composition of Magenta Image-Forming Layer Coating Solution

| | |
|---|---|
| Above magenta pigment dispersion mother solution (magenta pigment composition 1/ magenta pigment composition 2: 95/5 (parts)) | 163 parts |
| Polyvinyl butyral (Denka Butyral #2000-L, manufactured by Denki Kagaku Kogyo Co., Ltd., Vicut softening point: 57° C.) | 4.0 parts |
| Wax-based compound | |
| Stearic acid amide (Newtron 2, manufactured by Nippon Seika Co., Ltd.) | 1.0 part |
| Behenic acid amide (Diazmid BM, (manufactured by Nippon Kasei Co., Ltd.) | 1.0 part |
| Lauric acid amide (Diamid Y, (manufactured by Nippon Kasei Co., Ltd.) | 1.0 part |
| Palmitic acid amide (Diamid KP, (manufactured by Nippon Kasei Co., Ltd.) | 1.0 part |
| Erucic acid amide (Diamid L-200, (manufactured by Nippon Kasei Co., Ltd.) | 1.0 part |
| Oleic acid amide (Diamid O-200, (manufactured by Nippon Kasei Co., Ltd.) | 1.0 part |
| Nonionic surfactant (Chemistat 1100, manufactured by Sanyo Chemical Industries, Co., Ltd.) | 0.7 parts |
| Rosin (KE-311, manufactured by Arakawa Kagaku Co., Ltd., components: resin acid 80 to 97%, | 4.6 parts |
| resin acid components: | |
| abietic acid: 30 to 40% | |
| neoabietic acid: 10 to 20% | |
| dihydroabietic acid: 14% | |
| tetrahydroabietic acid: 14%) | |
| Pentaerythritol tetraacrylate (NK ester A-TMMT, manufactured by Shin-Nakamura Kagaku Co., Ltd.) | 2.5 parts |
| Surfactant (Megafac F-176PF, solid content: 20%, manufactured by Dainippon Chemicals and Ink Co., Ltd.) | 1.3 parts |
| m-Propyl alcohol | 848 parts |
| Methyl ethyl ketone | 246 parts |

The obtained image-forming layer had the following physical properties.

The surface hardness of the image-forming layer is preferably 10 g or more when measured with a sapphire needle, and it was specifically 200 g or more.

The Smooster value of the surface at 23° C., 55% RH is preferably from 0.5 to 50 mmHg (=about 0.0665 to 6.65 kPa), and it was specifically 3.5 mmHg (=about 0.47 kPa).

The coefficient of static friction of the surface is preferably 0.2 or less, and it was specifically 0.08.

The surface energy was 25 $mJ/m^2$, and the contact angle with water was 98.8°.

The optical density (OD) was 1.51, the layer thickness was 0.38 μm, and the OD/layer thickness was 3.97.

The deformation rate of the light-to-heat converting layer was 160% when recording was performed at linear velocity of 1 m/sec or more with laser beams having light intensity at exposure surface of 1,000 $W/mm^2$ or more.

Preparation of Thermal Transfer Sheet C

Thermal transfer sheet C was prepared in the same manner as in the preparation of thermal transfer sheet K, except that the cyan image-forming layer coating solution having the composition shown below was used in place of the black image-forming layer coating solution. The layer thickness of the image-forming layer in the obtained thermal transfer sheet C was 0.45 μm.

Composition of Cyan Pigment Dispersion Mother Solution

| Cyan pigment composition 1 | |
|---|---|
| Polyvinyl butyral (Eslec B BL-SH, manufactured by Sekisui Chemical Industries, Ltd.) | 12.6 parts |
| Pigment Blue (pigment blue 54:7, C.I. No. 74160) (Cyanine Blue 700-10FG, manufactured by Toyo Ink Mfg. Co., Ltd.)) | 15.0 parts |
| Dispersion assistant (PW-36, manufactured by Kusumoto Kasei Co., Ltd.) | 0.8 parts |
| n-Propyl alcohol | 110 parts |

Composition of Cyan Pigment Dispersion Mother Solution

| Cyan pigment composition 2 | |
|---|---|
| Polyvinyl butyral (Eslec B BL-SH, manufactured by Sekisui Chemical Industries, Ltd.) | 12.6 parts |
| Pigment Blue 15 (C.I. No. 74160, Lionol Blue 7027, manufactured by Toyo Ink Mfg. Co., Ltd.) | 15.0 parts |
| Dispersion assistant (PW-36, manufactured by Kusumoto Kasei Co., Ltd.) | 0.8 parts |
| n-Propyl alcohol | 110 parts |

Composition of Cyan Image-Forming Layer Coating Solution

| | |
|---|---|
| Above cyan pigment dispersion mother solution (cyan pigment composition 1/ cyan pigment composition 2: 90/10 (parts)) | 118 parts |
| Polyvinyl butyral (Eslec B BL-SH, manufactured by Sekisui Chemical Industries, Ltd.) | 5.2 parts |
| Inorganic pigment (MEK-ST) | 1.3 parts |
| Wax-based compound | |
| Stearic acid amide (Newtron 2, manufactured by Nippon Seika Co., Ltd.) | 1.0 part |

-continued

| | |
|---|---|
| Behenic acid amide (Diamid BM, (manufactured by Nippon Kasei Co., Ltd.) | 1.0 part |
| Lauric acid amide (Diamid Y, (manufactured by Nippon Kasei Co., Ltd.) | 1.0 part |
| Palmitic acid amid. (Diamid KP, (manufactured by Nippon Kasei Co., Ltd.) | 1.0 part |
| Erucic acid amide (Diamid L-200, (manufactured by Nippon Kasei Co., Ltd.) | 1.0 part |
| Oleic acid amide (Diamid O-200, (manufactured by Nippon Kasei Co., Ltd.) | 1.0 part |
| Rosin (KE-311, manufactured by Arakawa Kagaku Co., Ltd., components: resin acid 80 to 97%, resin acid components: | 2.8 parts |
| abietic acid: 30 to 40% neoabietic acid: 10 to 20% dihydroabietic acid: 14% tetrahydroabietic acid: 14%) | |
| Pentaerythritol tetraacrylate (NK ester A-TMMT, manufactured by Shin-Nakamura Kagaku Co., Ltd.) | 1.7 parts |
| Surfactant (Megafac F-176PF, solid content: 20%, manufactured by Dainippon Chemicals and Ink Co., Ltd.) | 1.7 parts |
| n-Propyl alcohol | 890 parts |
| Methyl ethyl ketone | 247 parts |

The obtained image-forming layer had the following physical properties.

The surface hardness of the image-forming layer is preferably 10 g or more when measured with a sapphire needle, and it was specifically 200 g or more.

The Smooster value of the surface at 23° C., 55% RH is preferably from 0.5 to 50 mmHg (=about 0.0665 to 6.65 kPa), and it was specifically 7.0 mmHg (=about 0.93 kPa).

The coefficient of static friction of the surface is preferably 0.2 or less, and it was specifically 0.08.

The surface energy was 25 $mJ/m^2$, and the contact angle with water was 98.8°.

The optical density (OD) was 1.59, the layer thickness was 0.45 μm, and the OD/layer thickness was 3.53.

The deformation rate of the light-to-heat converting layer was 165% when recording was performed at linear velocity of 1 m/sec or more with laser beams having light intensity at exposure surface of 1,000 $W/mm^2$ or more.

Example 2

A thermal transfer sheet was prepared in the same manner as in Example 1 except for changing N-methyl-2-pyrrolidone in the light-to-heat converting layer coating solution to N-dimethylacetamide (boiling point: 165° C.).

Example 3

A thermal transfer sheet was prepared in the same manner as in Example 1 except for changing the polyimide resin in the light-to-heat converting layer coating solution to the following polyamideimide resin (Vylomax HR11NN, manufactured by Toyobo Co., Ltd., number average molecular weight: 15,000, Tg: 300° C.).

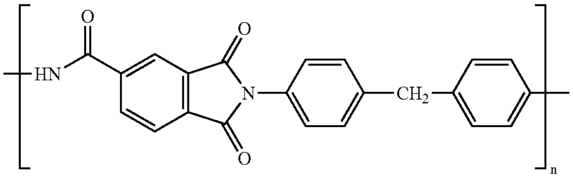

Comparative Example 1

A thermal transfer sheet was prepared in the same manner as in Example 1 except for changing the drying temperature to 150° C. and the drying time to 15 minutes when the light-to-heat converting layer was formed.

Comparative Example 2

A thermal transfer sheet was prepared in the same manner as in Example 2 except for changing the drying temperature to 150° C. and the drying time to 15 minutes when the light-to-heat converting layer was formed.

Comparative Example 3

A thermal transfer sheet was prepared in the same manner as in Example 3 except for changing the drying temperature to 150° C. and the drying time to 15 minutes when the light-to-heat converting layer was formed.

Preparation of Image-Receiving Sheet

The cushioning layer coating solution and the image-receiving layer coating solution each having the following composition were prepared.

| (1) Cushioning layer coating solution | |
|---|---|
| Vinyl chloride-vinyl acetate copolymer (main binder, MPR-TSL, manufactured by Nisshin Kagaku Co., Ltd.) | 20 parts |
| Plasticizer (Paraplex G-40, manufactured by CP. HALL. COMPANY) | 10 parts |
| Surfactant (fluorine surfactant, coating assistant, Megafac F-177, manufactured by Dainippon Chemicals and Ink Co., Ltd.) | 0.5 parts |
| Antistatic agent (quaternary ammonium salt, SAT-5 Supper (IC), manufactured by Nippon Junyaku Co., Ltd.) | 0.3 parts |
| Methyl ethyl ketone | 60 parts |
| Toluene | 10 parts |
| N,N-Dimethylformamide | 3 parts |

| (2) Image-receiving layer coating solution | |
|---|---|
| Polyvinyl butyral (Eslec B BL-SH, manufactured by Sekisui Chemical Industries, Ltd.) | 8 parts |
| Antistatic agent Sanstat 2012A, manufactured by Sanyo Chemical Industries, Co., Ltd.) | 0.7 parts |

-continued

| (2) Image-receiving layer coating solution | |
|---|---|
| Surfactant (Megafac F-177, manufactured by Dainippon Chemicals and Ink Co., Ltd.) | 0.1 parts |
| n-Propyl alcohol | 20 parts |
| Methanol | 20 parts |
| 1-Methoxy-2-propanol | 50 parts |

The above-prepared cushioning layer coating solution was coated on a white PET support (Lumiler #130E58, manufactured by Toray Industries Inc., thickness: 130 μm) with a narrow-broad coater and the coated layer was dried, and then the image-receiving layer coating solution was coated and dried. The coating amounts of these coating solutions were controlled so that the layer thickness of the cushioning layer after drying became about 20 μm and the layer thickness of the image-receiving layer after drying became about 2 μm. The white PET support was a void-containing plastic support comprising a laminate (total thickness: 130 μm, specific gravity: 0.8) comprising a void-containing polyethylene terephthalate layer (thickness: 116 μm, void ratio: 20%), and titanium oxide-containing polyethylene terephthalate layers provided on both sides thereof (thickness: 7 μm, titanium oxide content: 2%). The prepared material was wound in a roll, stored at room temperature for one week, and then used in the image recording by laser beam as shown below.

The obtained image-receiving layer had the following physical properties.

The surface roughness Ra is preferably from 0.4 to 0.01 μm, and it was specifically 0.02 μm.

The undulation of the surface of the image-receiving layer is preferably 2 μm or less, and it was specifically 1.2 μm.

The Smooster value of the surface of the image-receiving layer at 23° C., 55% RH is preferably from 0.5 to 50 mmHg (=about 0.0665 to 6.65 kPa), and it was specifically 0.8 mmHg (=about 0.11 kPa).

The coefficient of static friction of the surface of the image-receiving layer is preferably 0.8 or less, and it was specifically 0.37.

The surface energy of the surface of the image-receiving layer was 29 $mJ/m^2$, and the contact angle with water was 85.0°.

Formation of Transferred Image

The above-prepared image-receiving sheet (56 cm×79 cm) was wound around the rotary drum having a diameter of 38 cm provided with vacuum suction holes having a diameter of 1 mm (surface density of one hole in the area of 3 cm×8 cm) and vacuum-sucked. Subsequently, the above thermal transfer sheet K (black) cut into a size of 61 cm×84 cm was superposed on the image-receiving sheet so as to protrude from the image-receiving sheet uniformly, brought into contact closely and laminated on the image-receiving sheet so that air was sucked by suction holes, with squeezing by using a squeeze roller. The degree of pressure reduction in the state of suction holes being covered was −150 mmHg per 1 atm (=about 81.13 kPa). The drum was rotated and semiconductor laser beams of the wavelength of 808 nm were condensed from the outside on the surface of the laminate on the drum so that the laser beams became a spot of a diameter of 7 μm on the surface of the light-to-heat converting layer, and laser image recording (line image) was performed on the laminate by moving the laser beam at a right angle (by-scanning) to the rotary direction of the drum (main scanning direction). The conditions of laser irradiation were as follows. The laser beams used in the example was multi-beam two dimensional array comprising five rows along the main scanning direction and three rows along the by-scanning direction forming a parallelogram.

Laser power: 110 mW

Drum rotation speed: 500 rpm

By-scanning pitch: 6.35 μm

Surrounding temperature and humidity at recording: 18° C. 30%, 23° C. 50%, 26° C. 65%

The diameter of the drum for exposure is preferably 360 mm or more, and specifically 380 mm was used.

The size of the image was 515 mm×728 mm, and the resolution was 2,600 dpi.

The laminate finished laser recording was detached from the drum and thermal transfer sheet K was peeled from the image-receiving sheet manually. It was confirmed that only the irradiated area of the image-forming layer in thermal transfer sheet K had been transferred from thermal transfer sheet K to the image-receiving sheet.

In the same manner as above, the images were transferred to the image-receiving sheet from each of thermal transfer sheet Y, thermal transfer sheet M and thermal transfer sheet C. The transferred images of four colors were further transferred to a recording paper and a multicolor image was formed. Even when high energy laser recording was performed under different temperature humidity conditions with laser beams of multi-beam two dimensional array, a multicolor image having excellent image quality and stable transfer density could be formed.

In the stage of transfer to the actual paper, the thermal transfer unit having a dynamic friction coefficient against the insert platform of polyethylene terephthalate of from 0.1 to 0.7 and traveling speed of from 15 to 50 mm/sec was used. The Vickers hardness of the material of the heat roller of the thermal transfer unit is preferably from 10 to 100, and specifically the heat roller having Vickers hardness of 70 was used.

Every image obtained under three different surrounding temperatures and humidities was good.

Measurement of Sensitivity:

One line was recorded by laser beam under the recording surroundings of 23° C., 50% RH with changing the number of revolutions of the recording drum of the laser imaging apparatus. The recording energy was calculated from the number of revolutions of the drum which recorded the one line without breaking. The smaller the recording energy, more excellent is the sensitivity. The results obtained are shown in Table 1 below.

Measurement of Liquid Content:

The residual of the liquid components used for the formation was extracted at ° C. from the light-to-heat converting layer in the thermal transfer sheet, and the amount was detected by gas chromatography. The results obtained are shown in Table 1 below.

TABLE 1

| Example No. | Liquid Content (mass %) | Sensitivity (mj/cm$^2$) |
|---|---|---|
| Example 1 | 10.1 | 187 |
| Example 2 | 9.2 | 193 |
| Example 3 | 12.5 | 181 |
| Comparative Example 1 | 0.8 | 251 |
| Comparative Example 2 | 0.3 | 263 |
| Comparative Example 3 | 0.7 | 277 |

It can be seen from the results in Table 1 that the multicolor image-forming material according to the present invention is excellent in recording sensitivity.

The recording sensitivity of the multicolor image-forming material according to the present invention was also excellent under different temperature and humidity surroundings (18° C. 30%, 26° C. 65%).

The present invention can provide a multicolor image-forming material and a multicolor image-forming method capable of forming a large sized image which is high sensitivity, has excellent image quality and stable transfer density on an image-receiving sheet even when high energy laser recording was performed under different temperature humidity conditions with laser beams of multi-beam. By using the multicolor image-forming material and the multicolor image-forming method, the present invention can provide a contract proof corresponding to film-less CTP system and substituting analog style color proofs. This proof can realize color reproduction which coincides with printed matters and analog style color proofs for obtaining the approval of customers. The present invention can provide DDCP system by using the same pigment materials as used in the printing inks, effecting transfer to actual paper and generating no moire. The present invention can also provide a large sized high grade DDCP (A2/B2) capable of transferring to actual paper, capable of using the same pigment materials as used in the printing inks, and showing high approximation to printed matters.

This application is based on Japanese Patent application JP 2003-18865, filed Jan. 28, 2003, the entire content of which is hereby incorporated by reference, the same as if set forth at length.

What is claimed is:

1. A multicolor image-forming material comprising:

an image-receiving sheet comprising a support and an image-receiving layer; and at least four thermal transfer sheets each comprising a support, a light-to-heat converting layer and an image-forming layer, the at least four thermal transfer sheets comprising yellow, magenta, cyan and black thermal transfer sheets, wherein image-recording is performed by the method comprising the steps of:

superposing each one of the at least four thermal transfer sheets on the image-receiving sheet to be in a state of the image-forming layer being in contact with the image-receiving layer; and irradiating the thermal transfer sheet with laser beams in two-dimensional array to transfer an image in an area of the image-forming layer subjected to irradiation onto the image-receiving layer, and a recording area of a multicolor image in each of the thermal transfer sheets is a size of 515 mm×728 mm or more, a resolution of the transferred image is 2,400 dpi or more, and each of the light-to-heat converting layers comprises from 9.2 to 20% by weight of a substance which is liquid at 30° C.

2. The multicolor image-forming material according to claim 1, wherein the substance has a boiling point of 120° C. or more.

3. The multicolor image-forming material according to claim 1, wherein each of the light-to-heat converting layers comprises from 3 to 15% by weight of a substance which is liquid at 30° C.

4. The multicolor image-forming material according to claim 1, wherein a ratio of an optical density to a thickness (μm) of each of the image-forming layers is 1.80 or more, and a contact angle of the image-receiving layer in relation to water is 86° or less.

5. The multicolor image-forming material according to claim 1, wherein each of the light-to-heat converting layers comprises polyimide as a binder.

6. The multicolor image-forming material according to claim 4, wherein the ratio is 2.50 or more.

7. The multicolor image-forming material according to claim 1, wherein the recording area is a size of 594 mm×841 mm or more.

8. The multicolor image-forming material according to claim 1, wherein the resolution is 2,600 dpi or more.

9. A method for forming a multicolor image using the multicolor image-forming material according to claim 1, the method comprising the steps of:

preparing an image-receiving sheet comprising a support and an image-receiving layer and at least four thermal transfer sheets each comprising a support, a light-to-heat converting layer and an image-forming layer, the at least four thermal transfer sheets comprising yellow, magenta, cyan and black thermal transfer sheets;

superposing each one of the at least four thermal transfer sheets on the image-receiving sheet to be in a state of the image-forming layer being in contact with the image-receiving layer; and irradiating the thermal transfer sheet with laser beams in two-dimensional array to transfer an image in an area of the image-forming layer subjected to irradiation onto the image-receiving layer.

* * * * *